US00RE40971E

(19) United States
(12) Reissued Patent
Sutardja

(10) Patent Number: US RE40,971 E
(45) Date of Reissued Patent: Nov. 17, 2009

(54) DIRECT DRIVE PROGRAMMABLE HIGH SPEED POWER DIGITAL-TO-ANALOG CONVERTER

(75) Inventor: Sehat Sutardja, Los Altos Hill, CA (US)

(73) Assignee: Marvell International Ltd., Hamilton (BM)

(21) Appl. No.: 11/220,304

(22) Filed: Sep. 6, 2005

Related U.S. Patent Documents

Reissue of:
(64) Patent No.: 6,462,688
Issued: Oct. 8, 2002
Appl. No.: 09/737,474
Filed: Dec. 18, 2000

(51) Int. Cl.
*H03M 1/66* (2006.01)

(52) U.S. Cl. ..... 341/144; 341/143; 327/126; 327/129; 327/134; 375/295

(58) Field of Classification Search ..... 327/100, 327/103, 108, 126, 129, 131, 132–136; 341/143, 341/144, 147; 375/295, 296
See application file for complete search history.

(56) References Cited

U.S. PATENT DOCUMENTS

| | | | | |
|---|---|---|---|---|
| 3,297,951 | A | 1/1967 | Blasbaig | |
| 3,500,215 | A | 3/1970 | Leuthold et al. | |
| 3,521,170 | A | 7/1970 | Leuthold et al. | |
| 3,543,009 | A | 11/1970 | Voelcker | |
| 3,793,588 | A * | 2/1974 | Gerwen et al. | 375/296 |
| 3,793,589 | A | 2/1974 | Puckett | |
| 3,973,089 | A | 8/1976 | Puckett | |

(Continued)

FOREIGN PATENT DOCUMENTS

| | | |
|---|---|---|
| DE | 10 2004 017 497 | 11/2004 |
| EP | 0 800 278 | 8/1997 |
| JP | 58-111415 | 7/1983 |
| JP | 62-159925 | 7/1987 |
| JP | 63300700 | 12/1988 |
| JP | 3-273704 | 12/1991 |
| JP | 57-48827 | 3/1992 |

(Continued)

OTHER PUBLICATIONS

Analysis and Design of Analog Integrated Circuits, Fourth Edition; 1977; 7 pages.
Low–Noise Local Oscillator Design Techniques using a DLL–based Frequency Multiplier for Wireless Application; George Chien; 2000; 190 pages.
Monolithic CMOS Frequency Synthesizer for Cellular Applications; George Chien and Prof. Paul R. Gray, University of California, Berkeley, CA; 9 pages.
A 900–MHz Local Oscillator using a DLL–based Frequency Multiplier Technique for PCS Applications; George Chien and Paul R. Gray, University of California, Berkeley, CA; 3 pages.
A 10–b, 500–M Sample/s CMOS DAC in 0.6 mm2; Chi–Hung Lin and Klaas Bult; IEEE Journal of Solid–State Circuits, vol. 33, No. 12, Dec. 1996; 11 pages.
U.S. Appl. No. 60/106,265, filed Oct. 1998, Chan.
U.S. Appl. No. 60/107,105, filed Nov. 1998, Chan.
U.S. Appl. No. 60/107,702, filed Nov. 1998, Chan.

(Continued)

*Primary Examiner*—Howard Williams

(57) ABSTRACT

A current source is provided according to the present invention. The current source includes N current sources configured in a parallel arrangement, wherein N is at least two. Each of the N current sources includes a respective control input. The current source also includes M delay elements. An mth one of the M delay elements includes an input in communication with an m−1th one of the M delay elements. M is equal to N−1, and an output of the mth one of the M delay elements is arranged in communication with the control input of an m+1th one of the N current sources.

27 Claims, 9 Drawing Sheets

U.S. PATENT DOCUMENTS

| | | | |
|---|---|---|---|
| 4,071,842 | A | 1/1978 | Tewksbury |
| 4,112,253 | A | 9/1978 | Wilhelm |
| 4,131,767 | A | 12/1978 | Weinstein |
| 4,152,541 | A | 5/1979 | Yuen |
| RE30,111 | E | 10/1979 | Blood, Jr. |
| 4,309,673 | A | 1/1982 | Norberg et al. |
| 4,321,753 | A | 3/1982 | Fusari |
| 4,362,909 | A | 12/1982 | Snijders et al. |
| 4,393,370 | A | 7/1983 | Hareyama |
| 4,393,494 | A | 7/1983 | Belforte et al. |
| 4,408,190 | A | 10/1983 | Nagano |
| 4,464,545 | A | 8/1984 | Werner |
| 4,503,421 | A | 3/1985 | Hareyama |
| 4,527,126 | A | 7/1985 | Petrich et al. |
| 4,535,206 | A | 8/1985 | Falconer |
| 4,591,832 | A | 5/1986 | Fling et al. |
| 4,605,826 | A | 8/1986 | Kanemasa |
| 4,621,172 | A | 11/1986 | Kanemasa et al. |
| 4,621,356 | A | 11/1986 | Scipione |
| 4,626,803 | A | 12/1986 | Holm |
| 4,715,064 | A | 12/1987 | Claessen |
| 4,727,566 | A | 2/1988 | Dahlqvist |
| 4,746,903 | A | 5/1988 | Czarniak et al. |
| 4,816,830 | A | 3/1989 | Cooper |
| 4,817,081 | A | 3/1989 | Wouda et al. |
| 4,868,571 | A | 9/1989 | Inamasu |
| 4,878,244 | A | 10/1989 | Gawargy |
| 4,888,762 | A | 12/1989 | Arai |
| 4,894,820 | A | 1/1990 | Miyamoto |
| 4,935,919 | A | 6/1990 | Hiraguchi |
| 4,947,171 | A | 8/1990 | Pfeifer |
| 4,970,715 | A | 11/1990 | McMahan |
| 4,972,360 | A | 11/1990 | Cukier et al. |
| 4,988,960 | A | 1/1991 | Tomisawa |
| 4,993,045 | A | 2/1991 | Alfonso |
| 4,999,830 | A | 3/1991 | Agazzi |
| 5,018,134 | A | 5/1991 | Kokubo et al. |
| 5,043,730 | A | 8/1991 | Obinnata |
| 5,084,865 | A | 1/1992 | Koike |
| 5,119,365 | A | 6/1992 | Warner et al. |
| 5,136,260 | A | 8/1992 | Yousefi-Elezei |
| 5,148,427 | A | 9/1992 | Buttle et al. |
| 5,153,450 | A | 10/1992 | Ruetz |
| 5,164,725 | A | 11/1992 | Long |
| 5,175,764 | A | 12/1992 | Patel et al. |
| 5,185,538 | A | 2/1993 | Kondoh et al. |
| 5,202,528 | A | 4/1993 | Iwaooji |
| 5,204,880 | A | 4/1993 | Wurster et al. |
| 5,212,659 | A | 5/1993 | Scott et al. |
| 5,222,084 | A | 6/1993 | Takahashi |
| 5,243,346 | A | 9/1993 | Inami |
| 5,243,347 | A | 9/1993 | Jackson et al. |
| 5,245,231 | A | 9/1993 | Kocis et al. |
| 5,245,654 | A | 9/1993 | Wilkison et al. |
| 5,248,956 | A | 9/1993 | Himes |
| 5,253,249 | A | 10/1993 | Fitzgerald et al. |
| 5,253,272 | A | 10/1993 | Jaeger et al. |
| 5,254,994 | A | 10/1993 | Takakura et al. |
| 5,267,269 | A | 11/1993 | Shih et al. |
| 5,269,313 | A | 12/1993 | DiPinto |
| 5,272,453 | A | 12/1993 | Traynor et al. |
| 5,280,526 | A | 1/1994 | Laturell |
| 5,282,157 | A | 1/1994 | Murphy et al. |
| 5,283,582 | A | 2/1994 | Krenik |
| 5,305,379 | A | 4/1994 | Takeuchi |
| 5,307,064 | A | 4/1994 | Kudoh |
| 5,307,405 | A | 4/1994 | Sih |
| 5,323,157 | A | 6/1994 | Ledzius et al. |
| 5,325,400 | A | 6/1994 | Co et al. |
| 5,357,145 | A | 10/1994 | Segaram |
| 5,365,935 | A | 11/1994 | Righter et al. |
| 5,367,540 | A | 11/1994 | Kakuishi et al. |
| 5,375,147 | A | 12/1994 | Awata et al. |
| 5,388,092 | A | 2/1995 | Koyama et al. |
| 5,388,123 | A | 2/1995 | Uesugi et al. |
| 5,392,042 | A | 2/1995 | Pellon |
| 5,399,996 | A | 3/1995 | Yates et al. |
| 5,440,514 | A | 8/1995 | Flannagan et al. |
| 5,440,515 | A | 8/1995 | Chang et al. |
| 5,444,739 | A | 8/1995 | Uesugi et al. |
| 5,465,272 | A | 11/1995 | Smith |
| 5,471,665 | A | 11/1995 | Pace et al. |
| 5,479,124 | A | 12/1995 | Pun et al. |
| 5,489,873 | A | 2/1996 | Kamata et al. |
| 5,507,036 | A | 4/1996 | Vagher |
| 5,508,656 | A | 4/1996 | Jaffard et al. |
| 5,517,141 | A | 5/1996 | Abdi et al. |
| 5,517,435 | A | 5/1996 | Sugiyama |
| 5,521,540 | A | 5/1996 | Marbot |
| 5,537,113 | A | 7/1996 | Kawabata |
| 5,539,403 | A | 7/1996 | Tani et al. |
| 5,539,405 | A | 7/1996 | Norsworthy |
| 5,539,773 | A | 7/1996 | Knee et al. |
| 5,559,476 | A | 9/1996 | Zhang et al. |
| 5,568,064 | A | 10/1996 | Beers et al. |
| 5,568,142 | A | 10/1996 | Velazquez et al. |
| 5,572,158 | A | 11/1996 | Lee et al. |
| 5,572,159 | A | 11/1996 | McFarland |
| 5,577,027 | A | 11/1996 | Cheng |
| 5,579,004 | A | 11/1996 | Linz |
| 5,585,795 | A | 12/1996 | Yuasa et al. |
| 5,585,802 | A | 12/1996 | Cabler et al. |
| 5,587,681 | A | 12/1996 | Fobbester |
| 5,589,788 | A | 12/1996 | Goto |
| 5,596,439 | A | 1/1997 | Dankberg et al. |
| 5,600,321 | A | 2/1997 | Winen |
| 5,613,233 | A | 3/1997 | Vagher |
| 5,625,357 | A * | 4/1997 | Cabler ..... 341/143 |
| 5,629,652 | A | 5/1997 | Weiss |
| 5,648,738 | A | 7/1997 | Welland et al. |
| 5,651,029 | A | 7/1997 | Yang et al. |
| 5,659,609 | A | 8/1997 | Koizumi et al. |
| 5,663,728 | A | 9/1997 | Essenwanger |
| 5,666,354 | A | 9/1997 | Cecchi et al. |
| 5,684,482 | A | 11/1997 | Galton |
| 5,687,330 | A | 11/1997 | Gist et al. |
| 5,696,796 | A | 12/1997 | Poklemba |
| 5,703,541 | A | 12/1997 | Nakashima |
| 5,719,515 | A | 2/1998 | Danger |
| 5,726,583 | A | 3/1998 | Kaplinsky |
| 5,745,564 | A | 4/1998 | Meek |
| 5,757,219 | A | 5/1998 | Weedon et al. |
| 5,757,298 | A | 5/1998 | Manley et al. |
| 5,760,726 | A | 6/1998 | Koifman et al. |
| 5,790,060 | A | 8/1998 | Tesche |
| 5,796,725 | A | 8/1998 | Muraoka |
| 5,798,661 | A | 8/1998 | Runaldue et al. |
| 5,798,664 | A | 8/1998 | Nagahori et al. |
| 5,812,597 | A | 9/1998 | Graham et al. |
| 5,821,892 | A | 10/1998 | Smith |
| 5,822,426 | A | 10/1998 | Rasmus et al. |
| 5,825,819 | A | 10/1998 | Cogburn |
| 5,834,860 | A | 11/1998 | Parsons et al. |
| 5,838,177 | A | 11/1998 | Keeth |
| 5,838,186 | A | 11/1998 | Inoue et al. |
| 5,841,386 | A | 11/1998 | Leduc |
| 5,841,809 | A | 11/1998 | Koizumi et al. |
| 5,844,439 | A | 12/1998 | Zortea |
| 5,859,552 | A | 1/1999 | Do et al. |
| 5,864,587 | A | 1/1999 | Hunt |
| 5,880,615 | A | 3/1999 | Bazes |

5,887,059 A 3/1999 Xie et al.
5,892,701 A * 4/1999 Huang et al. ..... 708/819
5,894,496 A 4/1999 Jones
5,898,340 A 4/1999 Chatterjee et al.
5,930,686 A 7/1999 Devlin et al.
5,936,450 A * 8/1999 Unger ..... 327/237
5,940,442 A 8/1999 Wong et al.
5,940,498 A 8/1999 Bardl
5,949,362 A 9/1999 Tesche et al.
5,963,069 A 10/1999 Jefferson et al.
5,982,317 A 11/1999 Steensgaard-Madsen
5,999,044 A 12/1999 Wohlfarth et al.
6,005,370 A 12/1999 Gustayson
6,014,048 A 1/2000 Talaga et al.
6,037,812 A 3/2000 Gaudet
6,038,266 A 3/2000 Lee et al.
6,043,766 A 3/2000 Hee et al.
6,044,489 A 3/2000 Hee et al.
6,046,607 A 4/2000 Kohdaka
6,047,346 A 4/2000 Lau et al.
6,049,706 A 4/2000 Cook et al.
6,052,076 A 4/2000 Patton, III et al.
6,057,716 A 5/2000 Dinteman et al.
6,067,327 A 5/2000 Creigh et al.
6,087,968 A 7/2000 Roza
6,094,082 A 7/2000 Gaudet
6,100,830 A 8/2000 Dedic
6,121,831 A 9/2000 Mack
6,137,328 A 10/2000 Sung
6,140,857 A 10/2000 Bazes
6,148,025 A 11/2000 Shirani et al.
6,150,856 A 11/2000 Morzano
6,154,784 A 11/2000 Liu
6,163,283 A 12/2000 Schofield
6,163,289 A 12/2000 Ginetti
6,163,579 A 12/2000 Harrington et al.
6,166,572 A 12/2000 Yamoaka
6,172,634 B1 1/2001 Leonowich et al.
6,173,019 B1 1/2001 Hee et al.
6,177,896 B1 1/2001 Min
6,185,263 B1 2/2001 Chan
6,188,282 B1 2/2001 Montalvo
6,191,719 B1 2/2001 Bult et al.
6,192,226 B1 2/2001 Fang
6,201,490 B1 3/2001 Kawano et al.
6,201,831 B1 3/2001 Agazzi et al.
6,201,841 B1 3/2001 Iwamatsu et al.
6,204,788 B1 3/2001 Tani
6,211,716 B1 4/2001 Nguyen et al.
6,215,429 B1 4/2001 Fischer et al.
6,223,061 B1 4/2001 Dacus et al.
6,236,345 B1 5/2001 Dagnachew et al.
6,236,346 B1 5/2001 Schofield
6,236,645 B1 5/2001 Agazzi
6,249,164 B1 6/2001 Cranford, Jr. et al.
6,249,249 B1 6/2001 Obayashi et al.
6,259,680 B1 7/2001 Blackwell et al.
6,259,745 B1 7/2001 Chan
6,259,957 B1 7/2001 Alexander et al.
6,266,367 B1 7/2001 Strait
6,271,782 B1 8/2001 Steensgaard-Madsen
6,275,098 B1 8/2001 Uehara et al.
6,288,592 B1 * 9/2001 Gupta ..... 327/392
6,288,604 B1 9/2001 Shih et al.
6,289,068 B1 9/2001 Hassoun et al.
6,295,012 B1 9/2001 Greig
6,298,046 B1 10/2001 Thiele
6,307,490 B1 10/2001 Litfin et al.
6,309,077 B1 10/2001 Saif et al.
6,313,775 B1 11/2001 Lindfors et al.
6,332,004 B1 12/2001 Chan
6,333,959 B1 12/2001 Lai et al.
6,339,390 B1 1/2002 Velazquez et al.
6,340,940 B1 1/2002 Melanson
6,346,899 B1 2/2002 Hadidi
6,351,229 B1 2/2002 Wang
RE37,619 E * 4/2002 Mercer et al.
6,369,734 B2 4/2002 Volk
6,370,190 B1 4/2002 Young et al.
6,373,417 B1 4/2002 Melanson
6,373,908 B2 4/2002 Chan
6,377,640 B2 4/2002 Trans
6,377,683 B1 4/2002 Dobson et al.
6,385,238 B1 5/2002 Nguyen et al.
6,385,442 B1 5/2002 Vu et al.
6,389,077 B1 5/2002 Chan
6,408,032 B1 6/2002 Lye et al.
6,411,647 B1 6/2002 Chan
6,415,003 B1 7/2002 Raghaven
6,421,377 B1 7/2002 Langberg et al.
6,421,534 B1 7/2002 Cook et al.
6,433,608 B1 8/2002 Huang
6,441,761 B1 8/2002 Viswanathan
6,452,428 B1 9/2002 Mooney et al.
6,462,688 B1 10/2002 Sutardja
6,469,988 B1 * 10/2002 Yang et al. ..... 370/289
6,476,746 B2 11/2002 Viswanathan
6,476,749 B1 11/2002 Yeap et al.
6,477,200 B1 11/2002 Agazzi et al.
6,492,922 B1 12/2002 New
6,501,402 B2 12/2002 Boxho
6,509,854 B1 1/2003 Morita et al.
6,509,857 B1 1/2003 Nakao
6,531,973 B2 3/2003 Brooks et al.
6,535,987 B1 3/2003 Ferrant
6,539,072 B1 3/2003 Donnelly et al.
6,556,677 B1 4/2003 Hardy
6,563,870 B1 5/2003 Schenk
6,570,931 B1 5/2003 Song
6,576,746 B2 6/2003 McBride et al.
6,577,114 B1 6/2003 Roo
6,583,742 B1 6/2003 Hossack
6,594,304 B2 7/2003 Chan
6,608,743 B1 8/2003 Suzuki
6,633,178 B2 10/2003 Wilcox et al.
6,687,286 B1 2/2004 Leonowich et al.
6,690,742 B2 2/2004 Chan
6,714,825 B1 3/2004 Tanaka
6,721,379 B1 4/2004 Cranford, Jr. et al.
6,731,748 B1 5/2004 Edgar, III et al.
6,744,831 B2 6/2004 Chan
6,744,931 B2 6/2004 Komiya et al.
6,751,202 B1 6/2004 Henrie
6,775,529 B1 8/2004 Roo
6,816,097 B2 11/2004 Brooks et al.
6,823,028 B1 11/2004 Phanse
6,844,837 B1 1/2005 Sutardja et al.
6,864,726 B2 3/2005 Levin et al.
6,882,216 B2 4/2005 Kang
2001/0050585 A1 * 12/2001 Carr ..... 327/277
2002/0009057 A1 1/2002 Blackwell et al.
2002/0061087 A1 5/2002 Williams
2002/0084857 A1 7/2002 Kim
2002/0136321 A1 9/2002 Chan
2002/0181601 A1 12/2002 Huang et al.
2003/0002570 A1 1/2003 Chan
2003/0174660 A1 9/2003 Blon et al.
2004/0005015 A1 1/2004 Chan
2004/0090981 A1 5/2004 Lin et al.
2004/0091071 A1 5/2004 Lin et al.
2004/0105504 A1 6/2004 Chan
2004/0141569 A1 7/2004 Agazzi 2004/0208312 A1 10/2004 Okuda
2005/0025266 A1 2/2005 Chan

FOREIGN PATENT DOCUMENTS

| | | | |
|---|---|---|---|
| JP | 4-293306 | | 10/1992 |
| JP | 4-351109 | | 12/1992 |
| JP | 05064231 | A | 3/1993 |
| JP | 6029853 | | 2/1994 |
| JP | 6-97831 | | 4/1994 |
| JP | 6-276182 | | 9/1994 |
| JP | 7-131260 | | 5/1995 |
| JP | 9-55770 | | 8/1995 |
| JP | 9-270707 | | 3/1996 |
| JP | 10-126183 | | 5/1998 |
| JP | 2001-177409 | | 6/2001 |
| TW | 0512608 | | 12/2002 |
| TW | 0545016 | | 8/2003 |
| WO | WO 99/46867 | | 9/1999 |
| WO | WO 00/27079 | | 5/2000 |
| WO | WO 00/28663 | A3 | 5/2000 |
| WO | WO 00/28663 | A2 | 5/2000 |
| WO | WO 00/28668 | | 5/2000 |
| WO | WO 00/28691 | A3 | 5/2000 |
| WO | WO 00/28691 | A2 | 5/2000 |
| WO | WO 00/28712 | | 5/2000 |
| WO | WO 00/35094 | | 6/2000 |

OTHER PUBLICATIONS

U.S. Appl. No. 60/108,001, filed Nov. 1998, Chan.

U.S. Appl. No. 09/920,241, filed Aug. 2001, Roo.

U.S. Appl. No. 09/920240, filed Aug. 2001, Roo et al.

U.S. Appl. No. 09/737,743, filed Dec. 2000, Sutardja.

A 1. 2 GHz Programmable DLL–Based Frequency Multiplier for Wireless Applications, Dec. 2004, Wang et al.

A 1.24–GHz MonolithicCMOS VOC with PhaseNoise of–137 dBc/Hz at a3–MHz Offset, 1999, Hung et al., pp. 111–113.

A 1.8–GHz Low–Phase–Noise CMOS VCO Using Optimized Hollow Spiral Inductors, 1997, Craninckx et al., pp. 736–744.

A 1.8–GHz Low–Phase–Noise Voltage–Controlled Oscillator with Prescaler, 1995, Craninckx et al., pp. 1474–1482.

A 1.9–GHz Wide–Band IF Double Conversion CMOS Receiver for Cordless Telephone Applications, 1997, Rudell et al., pp. 2071–2088.

A 10 bit 80 MHz glitchless CMOS D/A converter, May 1991, Takakura et al., pp. 26.5.1–26.5.4.

A 100 Mb/s BiCMOS Adaptive Pulse–Shaping Filter, Dec. 1995, Shoval et al., pp. 1692–1702.

A 100 Mb/s CMOS 100Base–T4 Fast Ethernet Transceiver for Category 3,4 & 5 UTP, 1998, Chan et al.

A 10–b 125–MHz CMOS digital–to–analog converter (DAC) with threshold–voltage compensated current sources, Nov. 1994, Chin et al., pp. 1374–1380.

A 10–b 70–MS/s CMOS D/A converter, Apr. 1991, Nakamura et al., pp. 637–642.

A 130–MHz 8–b CMOS video DAC for HDTV applications, Jul. 1991, Fournier et al., pp. 1073–1077.

A 14–Bit Current–Mode La DAC Based Upon Rotated Data Weighted Averaging, Aug. 2000, Radke et al., pp. 1074–1084.

A 14–bit Intrinsic Acurracy Q2 Random Walk CMOS DAC, Dec. 1999, Van der Plas et, pp. 1708–1718.

A 2.5 V CMOS Delay–Locked Loop for an 18 Mbit, 500 Megabyte/s DRAM, 1994, Lee et al., pp. 1491–1496.

A 2.7–V 900–MHz/1.9–GHz Dual–Band Transceiver IC for Digital Wireless Communication, 1999, Leong et al., pp. 286–291.

A 3 V 10b 100MS/s Digital–to–Analog Converter for Cable Modem Applications, Aug. 2000, Lee et al., pp. 203–205.

A 30–MHz Hybrid Analog/Digital Clock Recovery Circuit in 2–um CMOS, 1990, Kim et al., pp. 1385–1394.

A 320 MHz CMOS triple 8b DAC with on–chip PLL and hardware cursor, Feb. 1994, Reynolds, pp. 50–51.

A 333MHz, 20mW, 18ps Resolution Digital DLL using Current–controlled Delay with Parallel Variables Resistor DAC (PVR–DAC), Aug. 2000, Eto et al., pp. 349–350.

A 3V Low Power 0.25um CMOS 100Mb/s Receiver for Fast Ethernet, 2000, Shoael et al.

A 3–V, 22–mV Multibit Current–Mode DAC with 100 dB Dynamic Range, Dec. 1996, Hamasaki et al., pp. 1888–1894.

A BiCMOS Double–Low–IF Receiver for GSM, 1997, Banu et al., pp. 521–524.

A CMOS Channel–Select Filter for a Direct–Conversion Wireless Receiver, 1996, Chang et al., pp. 62–63.

A CMOS Mixed–Signal 100Mb/s Receive Architecture for Fast Ethernet, 1999, Shoval et al.

A CMOS Oversampling D/A Converter with a Current–Mode Semidigital Reconstruction Filter, Dec. 1993, Su et al., pp. 1224–1233.

A CMOS Serial Link for Fully Duplexed Data Communication, Apr. 1995, Lee et al.

A CMOS Steering–Current Multiplying Digital–to–Analog Converter, 1995, Henriques et al., pp. 145–155.

A CMOS Transceiver Analog Front–End for Gigabit Ethernet over Cat–5 Cables, 2001, Roo et al.

A CMOS Transceiver for 10 Mb/s and 100–Mb/s Ethernet, Dec. 1998, Everitt et al.

A Constant Slew Rate Ethernet Line Driver, May 2001, Nack et al.

A DSP Receiver for 1000 Base–T PHY, 2001, He et al.

A Dynamic Line–Termination Circuit for Multireceiver Nets, Dec. 1993, Dolle, pp. 1370–1373.

A Fully Integrated Low–Noise 1–GHz Frequency Synthesizer Design for Mobile Communication Application, May 1997, Lee et al. pp. 760–765.

A Gigabit Transceiver Chip Set for UTP CA–6 Cables in Digital CMOS Technology, Feb. 2000, Azadet et al.

A high–performance CMOS 70–MHz palette/DAC, Dec. 1987, Letham et al., pp. 1041–1047.

A low glitch 10–bit 75–MHz CMOS video D/A converter, Jan. 1995, Wu et al., pp. 68–72.

A Low–Noise 1.6–GHz CMOS PLL with On–Chip Loop Filter, 1997, Parker et al., pp. 407, 409–410.

A Low–Noise RF Voltage–Controlled Oscillator Using On–Chip High–Q Three–Dimensional Coil Inductor and Micromachined Variable Capacitor, Jun. 1998, Young et al., pp. 128–131.

A Low–Noise, 900–MHz VCO in 0.6um CMOS, May 1999, Parker et al., pp. 588–591.

A Micromachined Variable Capacitor for Monolithic Low–Noise VCOS, 1996, Young et al., pp. 86–89.

A Mixed Signal 120M PRML Solution for DVD Systems, 1999, Baird et al.

A Mixed Signal DFE/FFE Receiver for 100Base–TX Applications, 2000, Kelly et al.

A Monolithic 2.3–Gb/s 100–mW Clock and Data Recovery Circuit in Silicon Bipolar Technology, Dec. 1993, Soyuer et al., pp. 1310–1313.
A Monolithic 480 Mb/s Parallel AGC/Decision/Clock–Recovery Circuit in 1.2–urn CMOS, Dec. 1993, Hu et al., pp. 1314–1320.
A New Approach for the Fabrication of Micromechanical Structures, Elsevier/Sequoia; Sensors & Actuators, Dec. 1998, Parameswaran et al., pp. 289–307.
A Self–Terminating Low–Voltage Swing CMOS Output Driver, 1988, Knight, Jr. et al., pp. 457–464.
A Single–Chip CMOS Direct–Conversion Transceiver for 900MHz Spread–Spectrum Digital Cordless Phones, 1999, Cho et al., 10 pages.
A Third Method of Generation and Detection of Single–Sideband Signals, proceedings of the I.R.E., Dec. 1956, Weaver, Jr., pp. 1703–1705.
A Two Chip 1.5 GBd Serial Link Interface, Dec. 1992, Walker et al.
Active Output Impedance for ADSL Line Drivers, Texas Instruments Application Report SL0A100, Nov. 2002, Stephens.
Adaptive Impedance Matching, 1994 IEEE International Symposium on Circuits and Systems, ISCAS '94., vol. 2, Jun. 1994, Munshi et al., pp. 69–72.
ADSL Line Driver/Receiver Design Guide, Part 1, Linear Tech Magazine, Feb. 2000, Regan.
An 80–MHz 8–bit CMOS D/A converter, Dec. 1986, Miki et al., pp. 983–988.
An 8–bit 2–ns Monolithic DAC, Feb. 1988, Tsutomu Kamoto.
An Adaptive Cable Equalizer for Serial Digital Rates to 400Mb/s, 1996, Baker.
An ADSL Integrated Active Hybrid Circuit, Texas Instruments presentation, undated, Hellums et al.*
An All Analog Multiphase Delay Locked Loop Using a Replica Delay Line for Wide Range Operation and Low–Jitter Performance, Mar. 2000, Moon et al., pp. 377–384.*
An Intergratable 1–2.5Gbps Low Jitter CMOS Transceiver with Built in Self Test Capability, 1999, Yee et al.*
An Operational Amplifier Circulator Based on the Weighted Summer, Jun. 1975, Fuad et al.*
Analysis and Optimatization of Monolithic Inductors and Transformers for RF Ics, 1997, Niknej ad et al., pp. 375–378.*
Analysis of Timing Jitter in CMOS Ring Oscillators, 1994 IEEE International Symposium on Circuits and Systems, 1994, ISCAS '94, vol. 4, May 30–Jun. 1994 pp. 27–30, vol. 4, 1994, Weigandt et al., pp. 27–30.*
Analysis, Design, and Optimization of Spiral Inductors and Transformers for Si RF IC's, Oct. 1998, Niknejad et al., pp. 1470–1481.*
Charge–Pump Phase–Lock Loops, Nov. 1980, Gardner, pp. 1849–1858.
CODEC for Echo–Canceling, Full–Rate ADSL Modems, Dec. 1999, Hester et al.
Combining Echo Cancellation and Decision Feedback Equalization, Bell System Technical Journal, Feb. 1979, Mueller, pp. 401–500.
Delay Based Monolithic CMOS Frequency Synthesizer for Portable Wireless Applications, May 1998, Chien.
Design of a 10–bit 100 MSamples/s BiCMOS D/A Converter, 1996, Harald et al., pp. 730–733.
Digital Generation of Low–Frequency Sine Waves, Jun. 1969, Davies, pp. 97–105.
Digital Logic and Computer Design, Prentice Hall Inc. 1979, 1979, Marto.
Digital Systems Engineering (Cover and p. 390–391, ) Cambridge University Press, no date, Daily et al.
Digital–to–analog Converter having Common–mode Isolation and Differential Output, IBM Journal of Research and Development, Jan. 1973, Hellwarth et al.
Doppler Estimation Using a Coherent Ultrawide–Band Random Noise Radar, Jun. 2000, Narayanan et al.
DP83220 CDLTM Twisted Pair FDDI Transceiver Device, National Semiconductor Product Sheet, Oct. 1992, unknown.
Dual Mode Transmitter with Adaptively Controlled Slew Rate and Impedance Supporting Wide Range Data Rates, 2001, Song.
Experimental Results and Modeling Techniques for Substrate Noise in Mixed–Signal Integrated Circuits, Apr. 1993, Su et al., pp. 420–430.
FA 18.5: A Delay Line Loop for Frequency Synthesis of De–Skewed Clock, Feb. 1994, Waizman, pp. 298–299.
FA 7.2: The Future of CMOS Wireless Transceivers, Feb. 1997, Abidi et al., pp. 118–119; 440.
Fibre Distributed Data Interface (FDDI)—Token Medium Dependent (TP–PMD), Sep. 1995, American National Standard.
FP 12.1:NRZ Timing Recovery Technique for Band–Limited Channels, 1996, Song et al.
FP 14.7: A Fully Integrated 2.7V 0.35um CMOS VCO for 5GHz Wireless Applications Design for Mobile, Feb. 1998, Kinget.
Future Directions in Silicon ICs for RF Personal Communications, 1995, Gray et al., pp. 83–90.
Gigabit Ethernet PHY Chip Sets LAN Speed Record for Cooper Story, 1998, Goldberg, 6 pages.
HC–5509B ITU CO/Loop Carrier SLIC, Aug. 2003, Intersil.
High Performance Electrical Signaling, Daily et al.
High–Speed Electrical Signaling: Overview and Limitations, IEEE Micro, 1998, Horowitz et al.
IEEE Standard 802.3: Part 3 Carrier Sense Multiple Access with Collision Detection (CSMA/CD) Access Method and Physical Detection, Mar. 2002, pp. 1–378.
Short Course: Local Area Networks, Feb. 1998, Rao; Kenney.
Integrated Analog–to–Digital and Digital–to–Analog Converters—Chapter 6, Kluwer Academic Publishers, 1994, Van de Plassche, pp. 211–271.
Integrated Circuits for Data Transmission Over Twisted Pair Channels, 1996, Johns et al., pp. 398–406.
Large Suspended Inductors on Silicon and Their Use in a 1–micrometer CMOS RF Amplifier, May 1993, Chang et al., pp. 246–248.*
Linear Technology High Speed Modern Solutions Info Card, unknown, unknown.*
Low–Jitter Process—Independent DLL and PLL Based on Self–Biased Techniques, Nov. 1996, Maneatis, pp. 1723–1732.*
Low–Power Equalizer Architectures for High–Speed Moderns, IEEE Communications Magazine, Oct. 1998, Azadet.*
Micro–Electronics Circuit 3rd Ed.; Saunders College Publishing, 1991, Sedra et al., pp. 62–63; 86–92, 95–97; 243–247.*

Mismatch Shaping for a Current–Mode Multibit Delta–Sigma DAC, Mar. 1999, Shui et al., pp. 331–338.*
Modeling and Analysis of Substrate Coupling in Integrated Circuits, Mar. 1996, Gharpurey et al., pp. 344–353.*
Modeling of CMOS Digital–to–Analog Converters for Telecommunication, May 1999, Wikner et al., pp. 489–499.
Monolithic High–Performance Three–Dimensional Coil Inductors for Wireless Communications, 1997, Young et al.
MP 4.8 A 1.9GHzMicromachined–Based Low–Phrase–Noise CMOS VCO, 1999, Dec et al., pp. 80–81, 449.
MTD214—EthernetEncoder/Decoder and 10BaseT Transceiver with Built–in Waveform Shaper, 1997, Myson Technology, pp. 11 Jan.
MTD972 (Preliminary) 100Base TX PCS/PMA, 1997, Myson Technology, Jan. 21.
Multifrequency Zero–Jitter Delay–Locked Loop, Jan. 1994, Efeendovich et al., pp. 67–70.
Numerically Stable Green Function for Modeling and Analysis of Substrate Coupling in Integrated Circuits, Apr. 1998, Niknejad et al., pp. 305–315.
On–chip Terminating Registers for High Speed ECL–CMOS Interfaces, 1992, Gabara, pp. 292–295.
Phase Noise in Multi–Gigahertz CMOS Ring Oscillators, 1998, Hajimiri et al., pp. 49–52.
PLL/DLL System Noise Analysis for Low Jitter Clock Synthesizer Design, 1994, Kim et al., pp. 31–34.
Principles of Data Conversion System Design, IEEE Press, 1995, Razavi.
Progress in High–Speed and High–Resolution CMOS Data Converters, Sep. 1995, Liberali et al., pp. 19–28.
Pulse, Digital, and Switching Waveforms, McGraw–Hill Inc., 1965, Millman et al., pp. 674–675.
Recent Developments in High Integration Multi–Standard CMOS Transceivers for Personal Communication Systems, 1998, Rudell et al., pp. 149–154.
SA 18.3: A 1.9GHz Wide–Band IF Double Conversion CMOS Integrated Receiver for Cordless Telephone Applications, 1997, Rudell et al., pp. 304–305, 476.*
SI IC–Compatible Inductors and LC Passive Filters, Aug. 1990, Nguyen et al., pp. 1028–1031.*
SP 21.2: A 1.9GHz Single–Chip IF Transceiver for Digital Cordless Phones, Feb. 1996, Sato et al.*
SP 23.6: A 1.8GHz CMOS Voltage–Controlled Oscillator, 1997, Razavi, pp. 388–389.*
SP 23.7: A Balanced 1.5GHz Voltage Controlled Oscillator, 1997, Dauphinee et al., pp. 390–391, 491.*
SP 23.8: Silicon Bipolar VCO Family for 1.1 to 2.2GHz with Fully–Integrated Tank and Tuning Circuits, Feb. 1997, Jansen et al., pp. 392–393, 492.*
SP 24.6: A 900MHz CMOS LC–Oscillator with Quadrature Outputs, 1996, Rofougaran et al.*
TA 8.7:A 2.7V GSM Transceiver ICs with On–Chip Filtering, 1995, Marshall et al.
Techdictionary.com definition of decoder, Link:http://www-.teghdictionary.com, undated.
The Authoritative Dictionary of IEEE Standards Terms 7 Edition, undated, p. 280.
The HC–5502X14X Telephone Subscriber Line InterfaceCircuits (SLIC), Jan. 1997, Phillips.
TP 11.1: Direct–Conversion Radio Transceivers for Digital Communications, 1995, Abidi.
TP 12.5 A 1.4GHz Differential Low–Noise CMDS Frequency Synthesizer using a Wideband PLL Architecture, 2000, Line et al., pp. 204–205, 458.
TP 13.5 A Single–Chip CMOS Direct–Conversion Transceiver for 900MHz Spread–Spectrum Digital Cordless Phones, 1999, Cho et al., pp. 420–430.
TP 9.2: A 900MHz Transceiver Chip Set for Dual–Mode Cellular Radio Mobile Terminals with an Integrated LC Resonator, 1993, Koullias et al., pp. 140–141, 278.
University of Pennsylvania CSE Digital Logic Lab re decoders. Link: http://www.cse.dmu.ac.uk/–sexton/wwwPages/cs2.html.
WA 18.7—A Combined 10/125Mbaud Twisted–PairLine Driver withProgrammablePerformance/Power Features, 2000, Shoval et al., pp. 314–315.
WP 23.6 A 2.6GHz/5.2GHz CMOS Voltage–Controlled Oscillator, 1999, Lam et al., pp. 402–403, 484.
WP 23.7 A 6.5GHz Monolithic CMOS Voltage–Controlled Oscillator, 1999, Liu et al., pp. 404–405, 484.
WP 23.8 A 9.8GHz Back–Gate Tuned VCD in 0.35um, 1999, Wang et al., pp. 406–407, 484.
Micro–Electronic Circuits 3rd Ed.; Saunders College Publishing, 1991, Sedra et al., pp. 48–115.
A Precision Baseline Offset and Drift Corrector for Low–Frequency Applications, IEEE Transactions On Instrumentation and Measurement, vol. IM–34, No. 3, Sep. 1985, Bertolaccini, Mario, et al., pp. 405–412.
Linear Technology, LT1355/LT1356, Dual and Quad 12MHz, 400V/us Op Amps, Linear Technology Corporation, no date, pp. 1–16.
Linear Technology, LT1358/LT1359, Dual and Quad 25MHz, 600V/us Op Amps, Linear Technology Corporation, no date, pp. 1–12.
Linear Technology, LT1361/LT1362, Dual and Quad 50MHz, 800V/us Op Amps, Linear Technology Corporation, pp. 1–12, no date, pp. 1–12.
Linear Technology, LT1364/LT1365, Dual and Quad 70MHz, 1000V/us Op Amps, Linear Technology Corporation, pp. 1–12, no date, pp. 1–12.
Linear Technology, LT1813/LT1814, Dual/Quad 3mA, 100MHz, 750V/us Operational Amplifiers, Linear Technology Corporation, pp. 1–16, no date, pp. 1–16.
Yamaguchi, et al., "400Mbit/s Submarine Optical Repeater Using Integrated Circuits," Fujitsu Laboratories Ltd. and English Language Translation, no date.
Uda, et al., "125Mbits/s Fiber Optic Transmitter/Receiver with Duplex Connector", Fiber Optic Communications Development Div., NEC Corporation, NEC Engineering, Ltd. and Trans, no date.
IEEE Standards 802.3ab–2002, "Part 3: Carrier sense multiple access with collision detection (CSMA/CD) Access method and physical layer specifications" , no date, pp. 147–249.
Farjad–rad, et al., 4.5 A 0.2–2GHz 12mW Multiplying DLL for Low–Jitter Clock Synthesis in Highly Integrated Data Communication Chip, 2002.
Gotoh, et al., All–Digital Multi–Phase Delay Locked Loop for Internal Timing Generation in Embedded and/or High–Speed DRAMS, 1997.
Johnson, et al., THAM 11.2: A Variable Delay Line Phase Locked Loop for CPU–Coprocessor Synchronization, 1998.
Sonntag, et al., FAM: 11.5: A Monolithic CMOS 10MHz DPLL for Burse–Mode, 1990.
Garlepp, et al., A Portable Digital DLL Architecture for CMOs Interface Circuits, 1999.
Lin, et al., A Register–Controller Symmetrical DLL for Double–Data–Rate DRAM, 1999.

Garlepp, et al., A Portable Digital DLL for High–Speed CMOS Interface Circuits, 1998.
Dehng, et al., Clock–Deskaw Buffer Using a SAR–Controlled Delay–Locked Loop, 2000.
Kim, et al., A Low–Power Small–Area 7.28–ps–Jitter 1–GHz DLL–Based Clock Generator, 2002.
Dehng, et al., A Fast–Lock Mixed–Mode DLL Using a 2–b SAR Algorithm, 2001.
Dunning, Jim, "An All–Digital Phase–Locked Loop with 50–Cycle Lock Time Suitable for High–Performance Microprocessors," IEEE Journal of Solid–State Circuits, vol. 30, No. 4, Apr. 1995, pp. 412–422.
Gigabit Ethernet 100BASE–T , Gigabit Ethernet Alliance, copyright 1997.*

* cited by examiner

DIRECT DRIVE PROGRAMMABLE HIGH SPEED POWER DIGITAL-TO-ANALOG CONVERTER

Matter enclosed in heavy brackets [ ] appears in the original patent but forms no part of this reissue specification; matter printed in italics indicates the additions made by reissue.

BACKGROUND OF THE INVENTION

Field of the Invention

The present invention relates generally to signal processing and signal waveshaping. More particularly, the present invention relates to signal processing and signal waveshaping of digital-to-analog converters.

BACKGROUND AND RELATED ART

Digital-to-analog conversion involves the process of converting digital codes into a continuous range of analog signal levels (voltage or current), for example, as discussed in Chapter 31, "D/A and A/D Converters" of The Electrical Engineering Handbook, ed. Richard C. Dorf, CRC Press 1993, the contents of which are hereby incorporated by reference. A digital-to-analog converter (hereinafter a DAC) is generally an electronic circuit that receives an n-bit codeword from an interface and generates an analog voltage or current that is proportional to the codeword.

One example of a DAC is discussed in U.S. Pat. No. 5,663,728, entitled A Digital-To-Analog Converter (DAC) and Method that set Waveform Rise and Fall Times to Produce an Analog Waveform that Approximates a Piecewise Linear Waveform to Reduce Spectral Distortion, issued on Sep. 2, 1997, the contents of which are hereby incorporated by reference. The DAC of the U.S. Pat. No. 5,663,728 patent employs a waveform shaping circuit to control the rise and fall times of each component waveform so that the analog waveform rising and falling edges settle to within a desired error bound of a linear output ramp.

U.S. Pat. No. 5,936,450, entitled A Waveshaping Circuit Using Digitally Controlled Weighted Current Summing, issued on Aug. 10, 1999, the contents of which are hereby incorporated by reference, discloses a waveshaping circuit. The waveshaping circuit of the U.S. Pat. No. 5,936,450 patent includes a controller and a current summing circuit controlled by the controller. The current summing circuitry selectively sinks combinations of component currents in response to a sequence of control signal sets to generate an output current signal having a desired waveform.

Many DACs attempt to generate desired signal waveform in response to a digital signal. For the purposes of this discussion, a signal output may include the output of a DAC and/or the output of one or more signal components within a DAC. For example, a signal component may correspond to an individual bit of a codeword. One conventional method generates a signal output with a slew rate controlled current source, as shown in FIG. 1. The voltage V measured across a resistor R is shown in FIG. 2. The waveform V includes sharp transition areas (e.g., corners) 1, 2 and 3, which may introduce electromagnetic interference. Such interference may inhibit accurate signal processing.

Another circuit which generates an output signal employs a current mirror 10 having an RC filter, as illustrated in FIG. 3. A current source 1 drives the current mirror 10. Current mirror 10 includes a first transistor 11 and a second transistor 12. Transistors 11 and 12 are preferably CMOS transistors.

The first transistor 11 includes gate-to-drain feedback, and is coupled to transistors 12 through the RC filter. The RC filter limits rise and fall times of the input signal I. However, the R and C components are typically process and/or temperature dependent. Such dependence causes variation in the output waveform as shown in FIG. 4. The dashed lines in FIG. 4 represent arbitrary output responses due to temperature and/or process variation. A stable output signal is difficult to obtain with such a circuit.

FIG. 5 depicts a D/A circuit employing a DAC32, a low pass filter 34, a voltage buffer 36, a transistor 38, and a resistor 39. Each level of a multilevel input signal is provided to DAC 32 for conversion to an analog signal. The LPF34 then determines the rise time of the output of the DAC 32, and the output is passed to voltage buffer 36. This construction presents two problems. First, the R and C values of LPF34 will vary with temperature and process variations, and the output signal will have a poor waveshape where the rise times are not constant. Second, since all input current is passed through the same DAC, and since bandwidth is a function of current level, each level of the multilevel signal will present a different rise time.

These signal processing problems are not adequately addressed in the art. Accordingly, there is a need for a current source to control an output signal which is independent of temperature and process considerations. There is also a need for a DAC to generate a signal having selectable transition areas (corners). There is a further need of a circuit to generate desirable waveshapes.

SUMMARY OF THE INVENTION

The present invention addresses these signal processing problems by providing a circuit to generate a desired output signal. The present invention also provides a DAC for converting a digital signal into an analog signal with a desirable waveshape.

According to a first aspect of the present invention, a current source includes N current sources configured in a parallel arrangement, wherein N is at least two. Each of the N current sources includes a respective control input. The current source includes M delay elements, with an mth one of the M delay elements including an input in communication with an m−1th one of the M delay elements. M is equal to N−1, and an output of the mth one of the M delay elements is arranged in communication with the control input of an m+1th one of the N current sources.

According to another aspect of the present invention, an apparatus includes N current sources configured in a parallel arrangement, wherein N is at least two. Each of the N current sources includes a respective control input and a respective biasing input. The apparatus also includes a biasing generator in communication with each of the biasing inputs of the N current sources, an apparatus input in communication with the control input of a first one of the N current sources, and M delay elements, with an mth one of the M delay elements including an input in communication with an m−1th one of the M delay elements. M is equal to N−1, and an output of the mth one of the M delay elements is arranged in communication with the control input of an m+1th one of the N current sources. The first one of the M delay elements is in communication with the apparatus input.

A method of supplying current is provided according to still another aspect of the present invention. The method includes the steps of: (i) arranging first through n current sources in a parallel arrangement, where n comprises the total number of current sources, and wherein the first current source supplies a first current and the second through n current source respectively supplies second through n currents; and (ii) delaying the second through n currents each with respect the first current.

These and other objects, features and advantages will be apparent from the following description of the preferred embodiments of the present invention.

BRIEF DESCRIPTION OF THE DRAWINGS

The present invention will be more readily understood from a detailed description of the preferred embodiments taken in conjunction with the following figures.

DETAILED DESCRIPTION OF THE PREFERRED EMBODIMENTS

The present invention will be described with respect to circuits and methods for shaping waveforms, and in particular, to a digital-to-analog converter (DAC) employing such a waveshaping circuit. However, as will be appreciated by those skilled in the art, the present invention is not limited to applications involving DACs, but also may be applied to other applications, such as signal processing, systems to control signal rise/fall time, signal storage, communications, etc. Moreover, while the present invention is particularly suited to applications in the read channel of a hard disk drive, many other applications will suggest themselves to persons of skill in the electrical engineering arts. Furthermore, the present invention is particularly suitable for use with the structure described in U.S. patent application Ser. No. 09/737743, entitled "Active Replica Transformer Hybrid", filed concurrently herewith, the contents of which are incorporated herein by reference.

Figure 6:
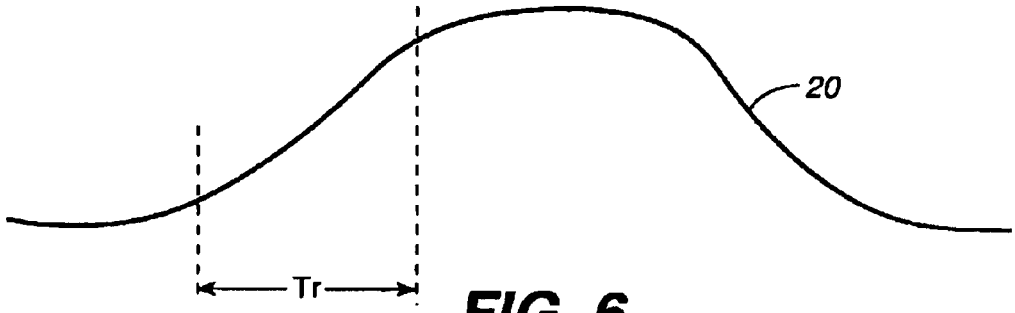
FIG. 6 is a graphical depiction of a waveshape having smooth transition areas.

FIG. 6 illustrates a desired signal output 20. The output waveform 20 includes smooth transition areas, which reduce noise such as electromagnetic interference. A preferred rise time ("$T_r$") for a DAC is 3–5 nanoseconds (ns).

Figure 7:
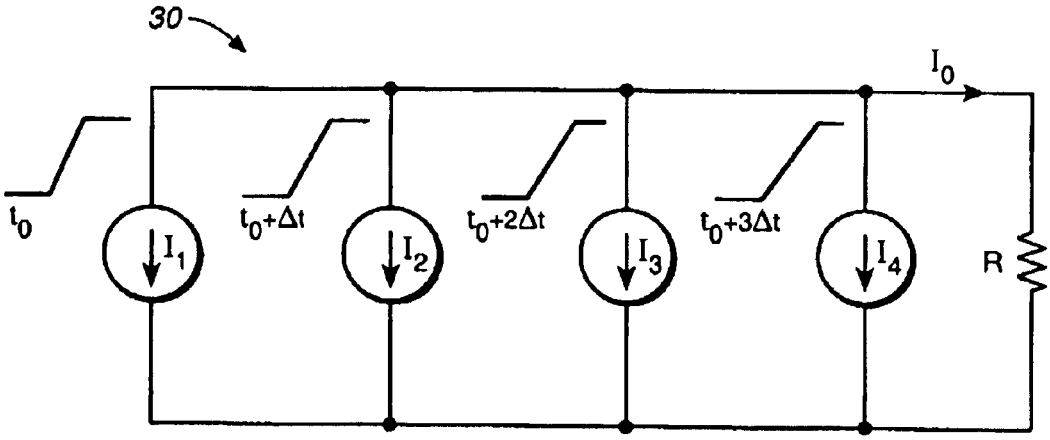
FIG. 7 is a circuit diagram of a current source according to the present invention.
Figure 8:
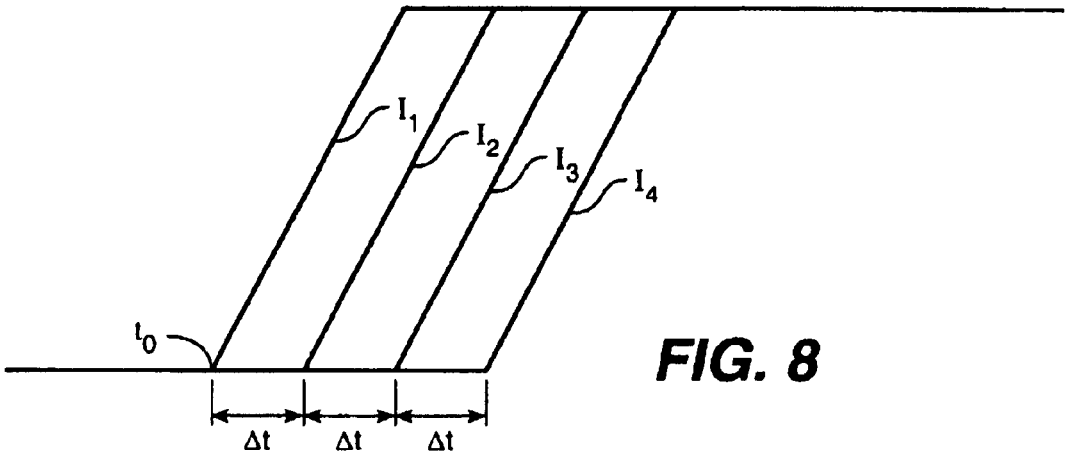
FIG. 8 is a graphical depiction of current components of the current source illustrated in FIG. 6.

The present invention generates a signal to approximate the desired signal output 20 with a current source 30. As shown in FIG. 7, current source 30 includes a plurality of current sources. For example, current source 30 may include current sources $I_1$, $I_2$, $I_3$ and $I_4$. Current sources $I_1$, $I_2$, $I_3$ and $I_4$ each preferably generate a respective current $I_n$, where n is 1, 2, 3 or so forth. The signals $I_n$ are preferably equal in magnitude and form, and may include a signal delay. In the FIG. 7 example, current sources $I_n$ each generate a linear ramp. For example, consider a signal I1, which includes a linearly rising edge starting at time t0. Current I2 mirrors current I1, except that I2 includes a linearly rising edge starting at time t0+Δt. The variable Δt represents an amount of delay time. Current I3 mirrors currents I1 and I2, except that current I3 includes a linearly rising edge starting at time t0+2Δt. Similarly, current I4 mirrors currents I1, I2, and I3, except that its linearly rising edge starts at time t0+3Δt. The relative waveform components for currents $I_1$, $I_2$, $I_3$ and $I_4$ are shown in FIG. 8.

Figure 9:
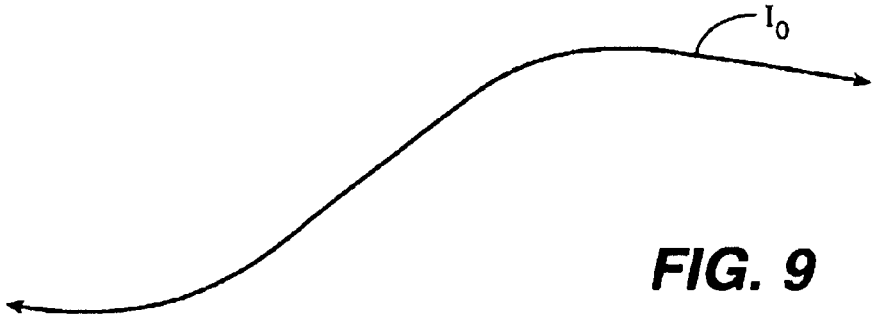
FIG. 9 is a graphical depiction of a resultant output waveshape from the current source illustrated in FIGS. 6 and 7.

Currents I1, I2, I3 and I4 are summed (or mixed) to produce a resultant waveform I0 as shown in FIG. 9. Waveform I0 approximates the desired output signal shown in FIG. 6. Like the desired output signal of FIG. 6, waveform I0 has many desirable properties. For example, I0 has selectable transition areas (corners). The transition areas can be smooth, or sharp, by selectively adjusting the length of Δt. Also, waveform I0 accommodates arbitrary rise/fall times.

Figure 10:
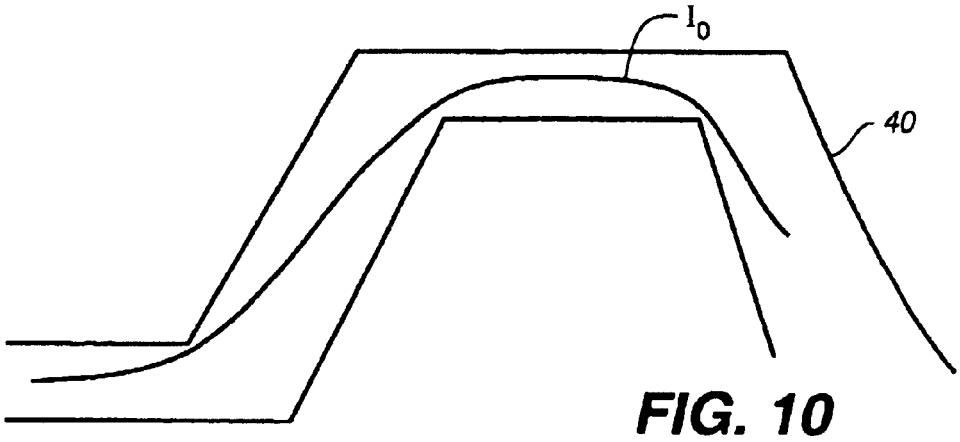
FIG. 10 is a graphical depiction of a waveform template, and a waveshape that fits within the template.

The waveform I0 can also be adjusted by varying Δt to fit within specified requirements. For example, with reference to FIG. 10, waveform I0 can be adjusted to fit within a template 40, for example, as provided by the IEEE standard waveform shape. In this example, I0 has been optimized to produce low electromagnetic interference and to fit within the IEEE template 40.

The delay variable Δt is preferably controlled using a delayed-lock loop or is controlled by reference to an external clock. As such, Δt can be precisely regulated. A waveform which is independent of temperature and/or process considerations can then be generated.

The generation of a linear ramp is explained with reference to FIGS. 11–13. A signal is produced from current source 50, which includes a plurality of current sources I1 through In. Each of the plurality of current sources generates a replica signal I. In this example, input signal I is preferably a square waveform. The signal I is delayed by Δt from each subsequent current source, after the initial current source I1. For example, I2 is delayed by Δt, and In is delayed by n−Δt. The currents are summed (or mixed) in a known manner to produce an output which approximates a linear ramp.

Figure 12A:
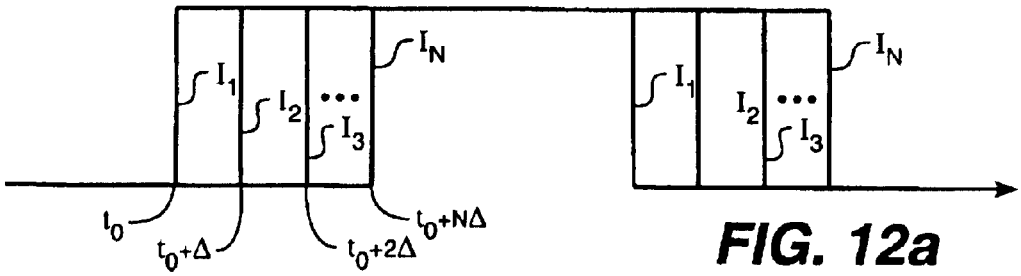
FIGS. 12a–12c are graphical depictions of waveshapes generated by the current source of FIG. 10.
Figure 12B:
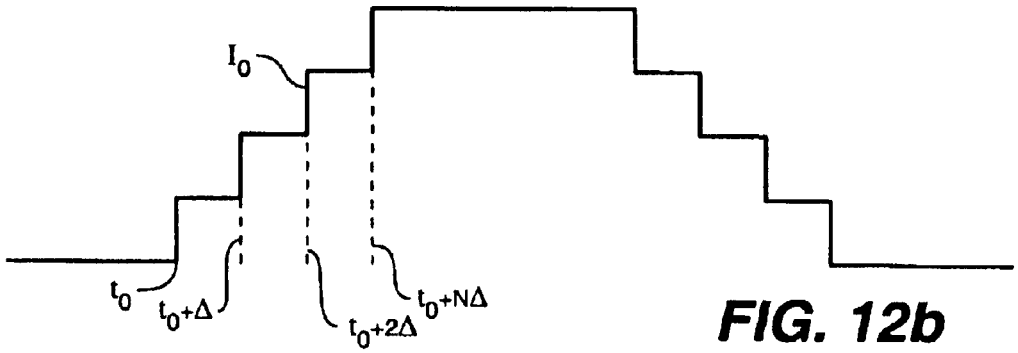
Figure 12C:
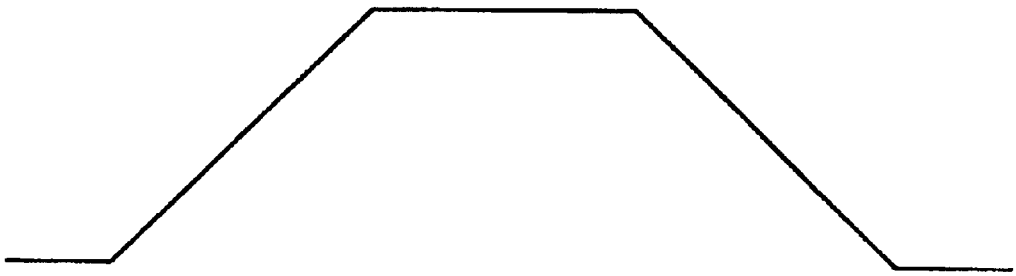

With reference to FIG. 12a, the signal components of the individual current sources are relatively illustrated. FIG. 12b illustrates the resultant waveshape I0, which includes a stair-step pattern. A linear ramp, as shown in FIG. 12c, is approximated as the length of the delay variable Δt is decreased.

Figure 13:
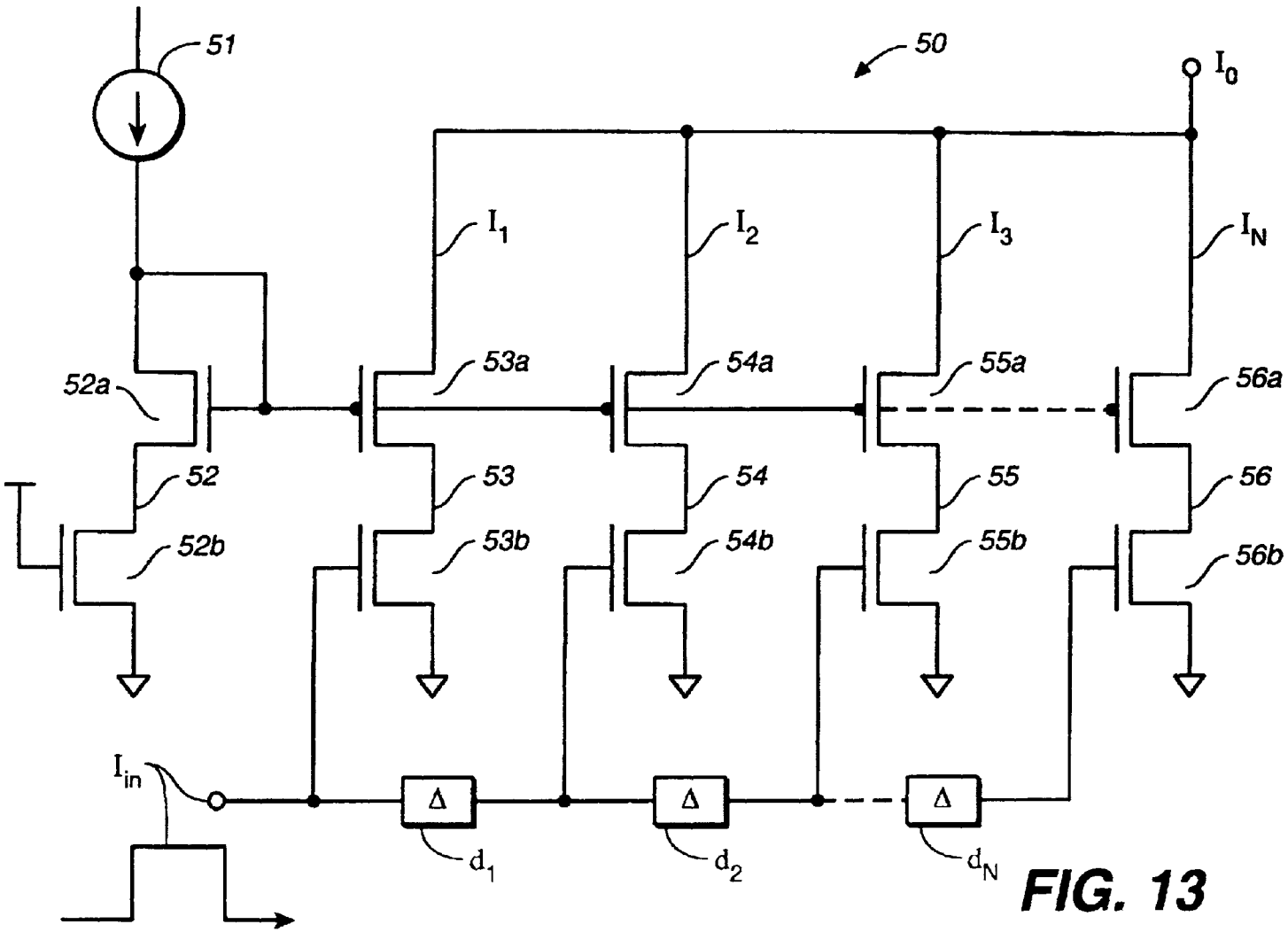
FIG. 13 is a circuit diagram of a current source according to the present invention.

A circuit diagram of the current source 50 is shown in FIG. 13. Current source 50 includes a plurality of transistor pairs 52–56, where pair 56 represents the nth transistor pair.

With reference to FIG. 13, a current source 51 drives transistor pair 52. Transistor pair 52 includes a transistor 52a communicating with a transistor 52b. Transistor 52a is preferably configured with gate-to-drain feedback. The gate of transistor 52b is biased so as to operate in an "on" state. The gate/drain of transistor 52a communicates with the gates of transistors 53a, 54a, 55a and 56a. The drains of transistors 53a–56a each communicates with an output Io. The gates of transistors 53b–56b each communicates with an input waveform Iin (e.g., a square signal), some through delay elements. For example, the gate of transistor 54b communicates with waveform Iin through delay element d1. The gate of transistor 55b communicates with waveform Iin through delay element d2 and delay element d1. Similarly, the gate of transistor 56b communicates with waveform Iin through each of the delay elements d1 through dn. In the preferred embodiment, each of delay elements d1–dn delays the signal by Δ. Delay elements can be realized via known delay locked loops.

The operational aspects of FIG. 13 are now even further explained. Initially, waveform Iin is communicated to the gate of transistor 53b, which turns on the transistor pair 53. A signal I1, which is proportional to the waveform Iin, is output at Io. Waveform Iin is also communicated to delay element d1, which delays the waveform by Δ seconds. After Δ seconds, delay element d1 communicates the delayed waveform to the gate of 54b, which turns on the transistor pair 54. A signal I2, which is proportional to Iin, is output at Io. The resultant waveform Io includes the sum (or mixture) of signals 11 and 12. The input waveform Iin is respectively delayed before communicating with the gates of transistors 55b and 56b. Transistor pairs 55 and 56 are activated (e.g., turned on) and respectively supply current 13 and In, which are added to the resultant waveform I. The current source 50, as shown in FIG. 11, is therefore realized.

Figure 1:
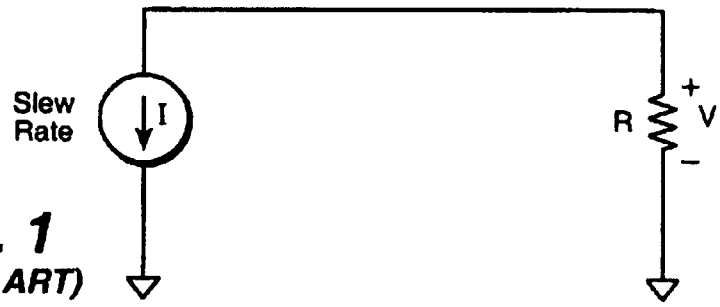
FIG. 1 (PRIOR ART)
FIG. 1 is a diagram of a conventional circuit, which includes a slew rate controlled current source.
Figure 2:
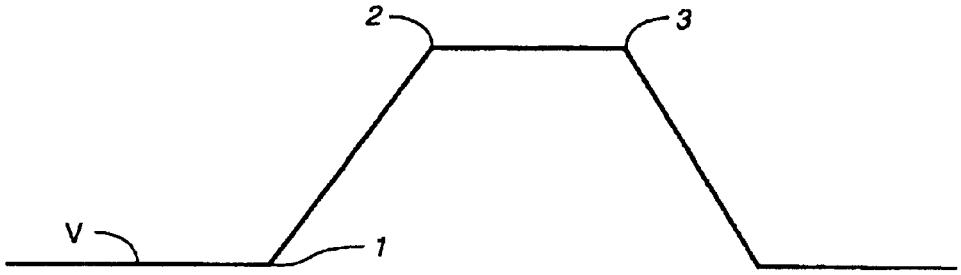
FIG. 2 is a graphical depiction of a waveshape corresponding to an output of the FIG. 1 circuit.
Figure 3:
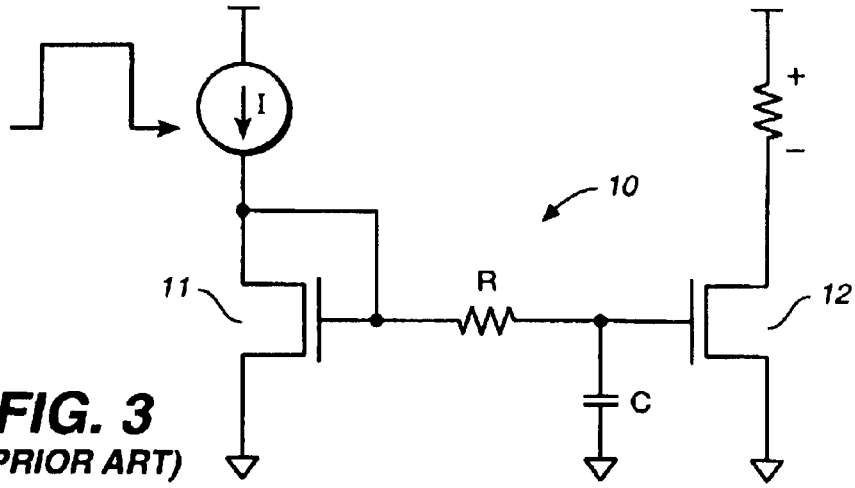
FIG. 3 (PRIOR ART)
FIG. 3 is a view of a conventional circuit including a current mirror having an RC filter.
Figure 4:
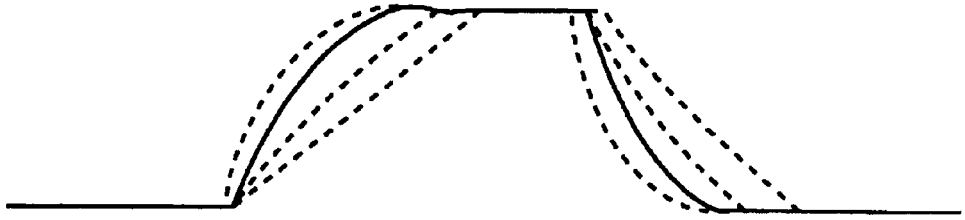
FIG. 4 is a graphical depiction of a waveshape corresponding to an output of the FIG. 3 circuit.
Figure 5:
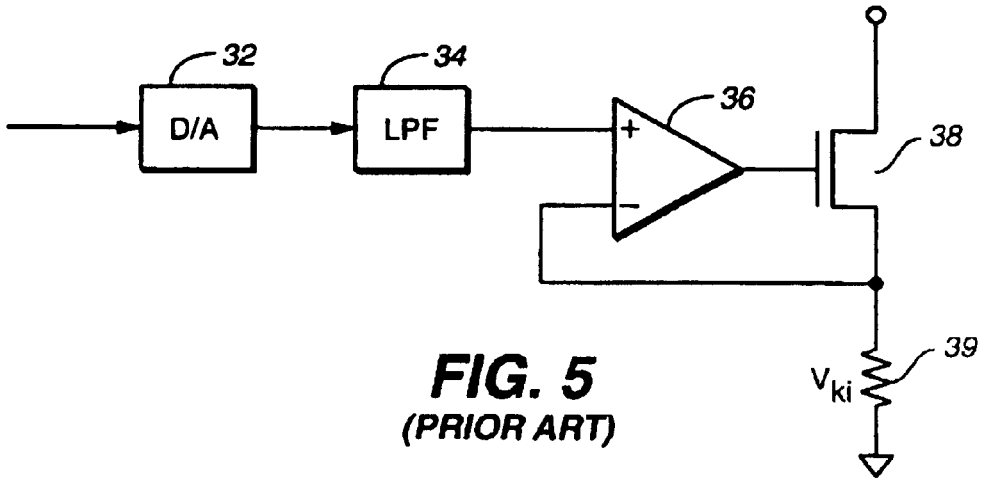
FIG. 5 (PRIOR ART)
FIG. 5 is a schematic block diagram of a D/A circuit.
Figure 11:
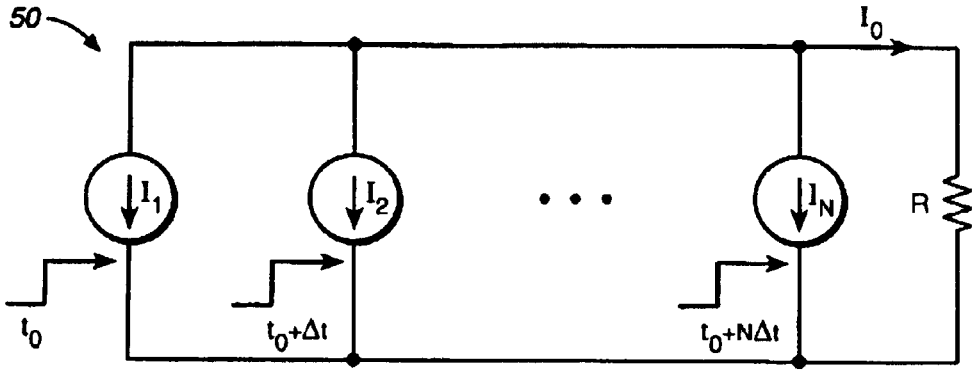
FIG. 11 is a circuit diagram of a current source according to the present invention.

There are many advantages of the configurations shown in FIGS. 11 and 13. For example, individual current sources (e.g., In) can be turned on/off on demand, particularly since Vgs is large and constant. Also, the current source 50 will generally consume less power than the current mirror shown in FIG. 3, particularly since a current mirror typically employs a DC bias. An additional advantage is that with a small Iin, the VGS voltage is also small (e.g., close to the threshold voltage VT). In such a case, VGS-VT-VDS equals a small number of current sources with negative VDS.

Figure 14:
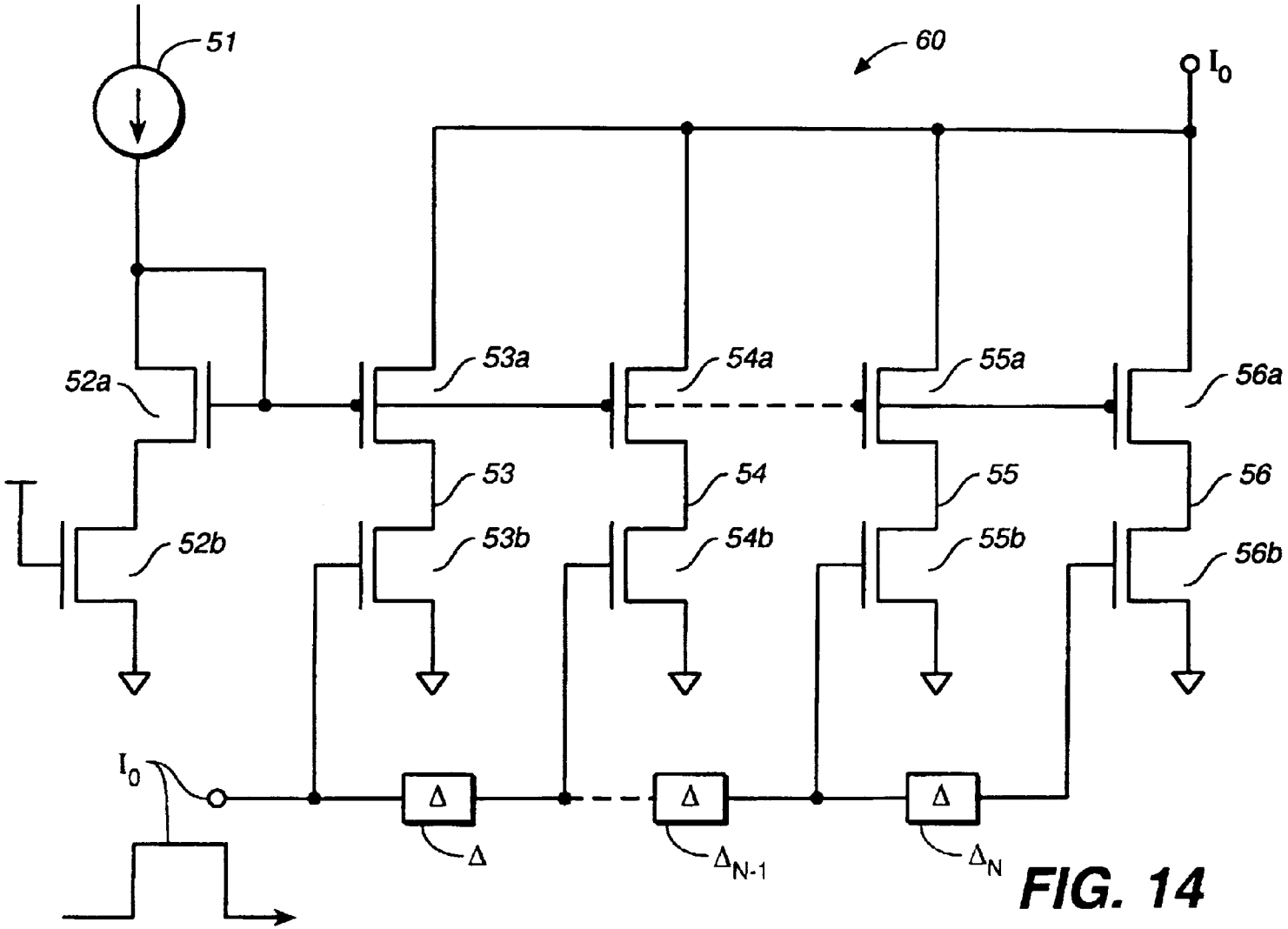
FIG. 14 is a circuit diagram of a current source having variable delay elements according to the present invention.

A further current source 60 is shown in FIG. 14. The current source 60 is configured in the same manner as the current source 50 shown in FIG. 13, except that the delay elements may include variable delays. The same components with respect to FIG. 13 are labeled with their same reference numerals in FIG. 13. In the FIG. 14 embodiment, delay elements Δ are non-uniform throughout the circuit. For example, Δ may involve a longer delay than Δn−1, and so forth. Non-uniform delays may be employed to generate a smooth waveform. Multiple delay-locked-loops are preferably used to achieve different delay times.

Figure 15A:
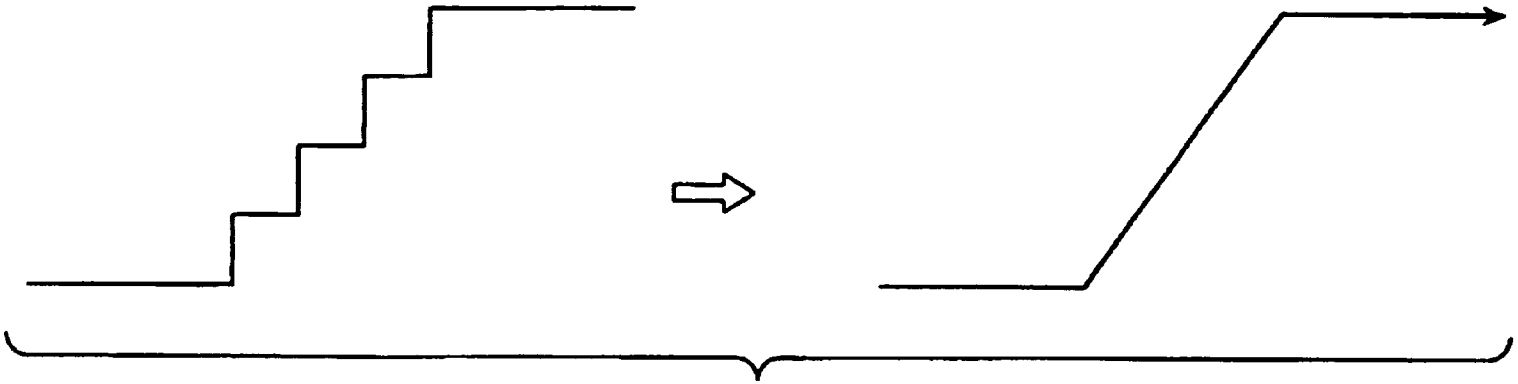
FIG. 15a is a graphical depiction of a waveform generated with uniform delay element.
Figure 15B:
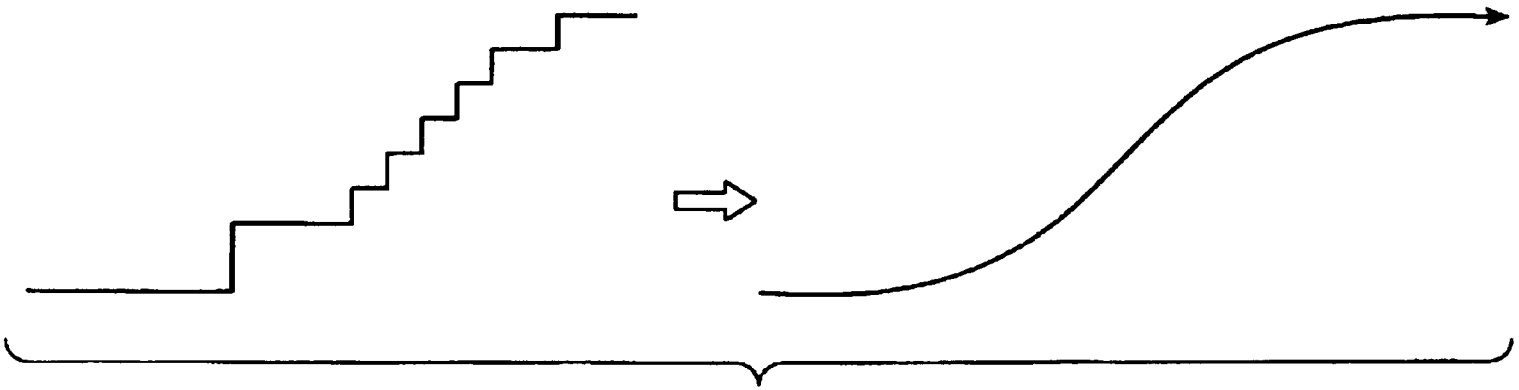
FIG. 15b is a graphical depiction of a waveform generated with non-uniform delay element.

To illustrate, an output waveform processed with uniform delay elements is shown in FIG. 15a. Here a stair step waveform is produced, which may approximate a linear ramp, particularly as the variable Δ is decreased in length (e.g., time). In contrast, the amount of delay is varied with respect to individual delay elements as shown in FIG. 15b. The approximated waveshape of FIG. 15b is smooth (e.g., includes smooth transition areas) in comparison to the approximated linear waveshape of FIG. 15b. Seven steps (or corresponding current sources) are employed in a preferred embodiment for a Gigabit channel. Of course, the number of levels may be varied according to need or design without deviating from the scope of the present invention.

Figure 16:
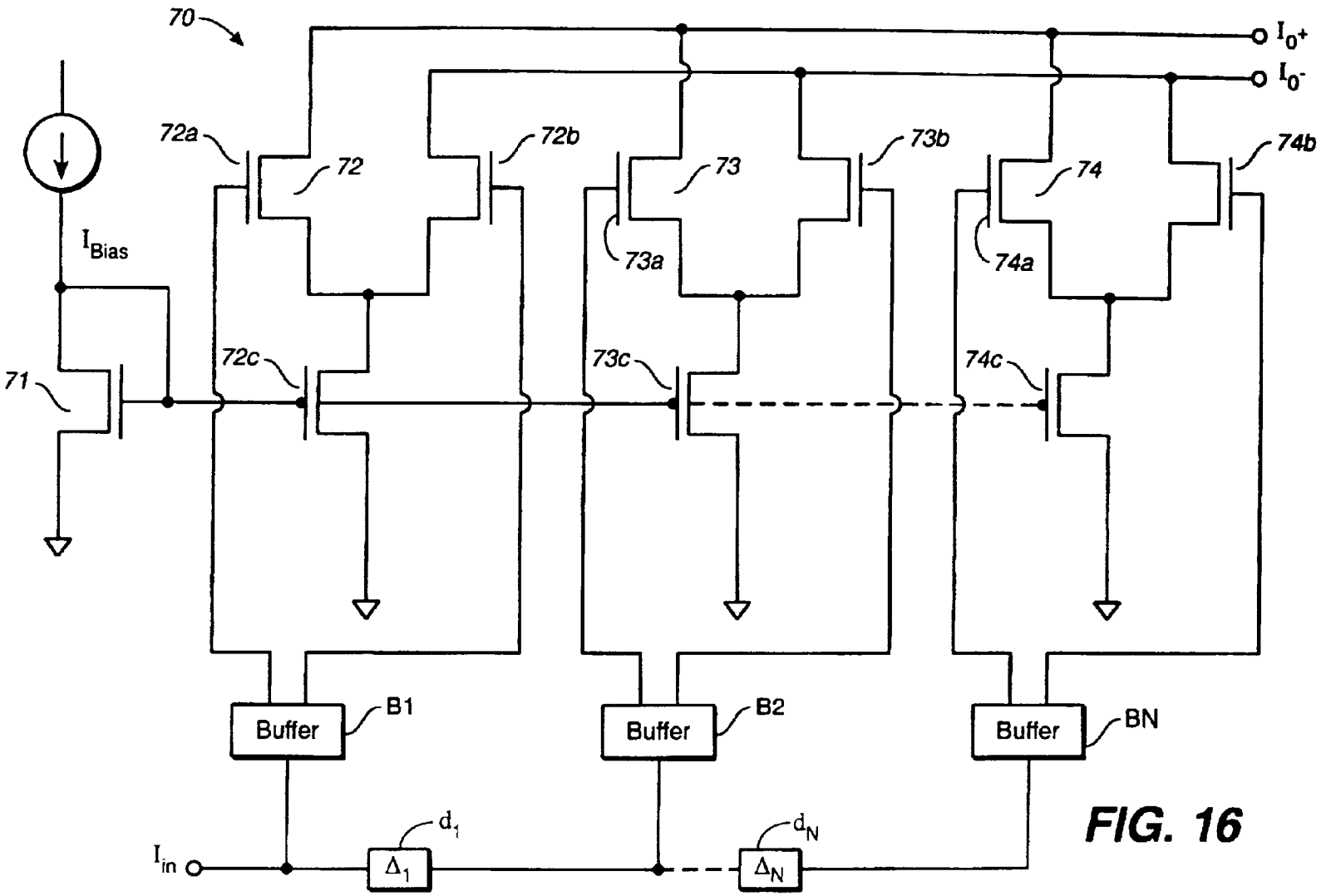
FIG. 16 is a circuit diagram of a current source including a plurality of differential transistor pairs according to the present invention.

A further embodiment of a current source is illustrated in FIG. 16. The illustrated current source 70 includes a plurality of differential transistor pairs 72–74, where 74 represents the nth differential transistor pair. A bias current $I_B$ is supplied to the gate of transistors 72c, 73c and 74c. An input waveform Iin is communicated to the gates of 72a, 72b, 73a, 73b, 74a and 74b. In the case of transistor pair 73 and 74, the input waveform Iin is delayed through delay elements d1 and d1+dn, respectively. Buffers B1–BN are optionally included in the circuit 70 to buffer the input signal Iin. A differential output (Io+, Io−) is accordingly produced.

The advantages of the FIG. 16 current source include constant power dissipation. Also, the circuit provides matching capabilities, for example, for use in an Ethernet channel.

Figure 17:
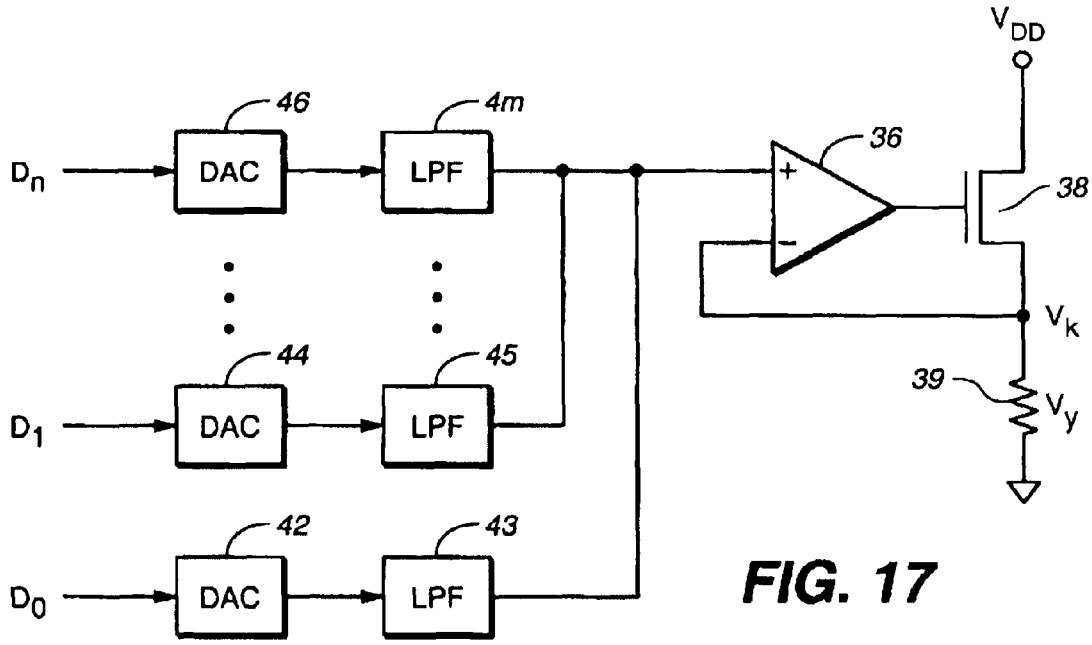
FIG. 17 is a circuit diagram of an alternative embodiment according to the present invention.

One drawback of the differential amplifier in FIG. 16 is that the differential amplifier is a Class A circuit which consumes unnecessary power even when no output is being transmitted. Moreover, a significant number of transistors is required to provide an adequately smoothed output current, thus requiring a large chip area. FIG. 17 depicts a schematic diagram of another embodiment according to the present invention which operates in Class B wherein one DAC is provided for each level of the multilevel input signal. DACs 42, 44, . . . 46 may be provided with corresponding LPFs 43, 45, 4m. Preferably, a circuit according to FIG. 13 supplies each DAC with a control current to provide a stair step output which defines the rise time. In such an embodiment, since each DAC receives control current, and not input current, the transistors which supply each DAC may be smaller than those used in the FIG. 13 embodiment. Additionally, since the control signal determines the rise time of the output of each DAC, the LPFs merely produce a smoother output.

In FIG. 17, multilevel input signal D0, D1, . . . Dn is provided to the parallel DACs 42, 44, . . . 46. The number of DACs may be varied depending on the application. This embodiment solves two problems. First, by providing the FIG. 17 circuit with a staircase waveform , for example, from FIG. 14, an LPF34 merely smoothes the staircase waveform rather than define rise time. Second, since the DACs are disposed in parallel, there will be no variations in rise time because each DAC has substantially the same current passing therethrough; that is there will be no bandwidth variation with resultant differences in rise time. The DACs may also be controlled by any appropriate circuitry, such as a decoder disposed prior to the DACs which would, in effect, select which DACs are activated by proper application of the input signals.

Thus, what has been described are circuits and methods to effectively shape a waveform. Furthermore, digital-to-analog conversion circuits employing such waveshaping circuits, which enhance signal conversion, have been described.

The individual components shown in outline or designated by blocks in the attached drawings are all well-known in the arts, and their specific construction and operation are not critical to the operation or best mode for carrying out the invention.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the following claims is to be accorded the broadest interpretation so as to encompass all such modifications and equivalent structures and functions. For example, the input signals for FIGS. 7, 11, , 13, 14 and 16 may be varied to produce different output waveforms. Also, the linear ramp produced by the current source of FIGS. 11 and 13, may be even further processed by the current source of FIG. 7, to produce smooth transition areas. Such modifications are within the scope of the present invention. Also, whereas the illustrated transistors are preferably CMOS transistor, n-type or p-type transistors may also be employed with the present invention.

What is claimed is:

[1. A current source comprising:

N current sources configured in a parallel arrangement, wherein N is at least two, and wherein each of the N current sources includes a respective control input; and M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources, wherein the M delay elements comprise at least one delay lock loop.]

[2. A current source according to claim 1, wherein the mth one of the M delay elements comprises a proportional delay with respect to the m−1th one of the M delay elements.]

[3. A current source according to claim 1, wherein the M delay elements are controlled with reference to at least one external signal.]

[4. A current source according to claim 1, wherein a sum of the N current sources provides a linear ramp waveform.]

[5. A current source according to claim 1, wherein the N current sources each provide a square waveform.]

[6. A current source according to claim 1, wherein current provided by said current source comprises smooth transition areas.]

[7. A current source according to claim 1, wherein the mth one of the M delaying means comprises a proportional delay with respect to the m−1th one of the M delaying means.]

[8. A current source comprising:

N means for providing current configured in a parallel arrangement, wherein N is at least two, and wherein each of the N current providing means includes a respective means for inputting; and M means for delaying, an mth one of the M delaying means including means for inputting in communication with an m−1th one of the M delaying means, wherein M is equal to N−1, and wherein means for outputting of the mth one of the M delaying means is arranged in communication with the inputting means of an m+1th one of the N current providing means, wherein the M delaying means comprise at least one delay lock loop.]

[9. A current source according to claim 8, wherein the M delaying means are controlled with reference to at least one external signal.]

[10. A current source according to claim 8, wherein a sum of the N current providing means provides a linear ramp waveform.]

[11. A current source according to claim 8, wherein the N current providing means each provide a square waveform.]

[12. A current source according to claim 8, wherein current provided by said current source comprises smooth transition areas.]

[13. An apparatus comprising:

N current sources configured in a parallel arrangement, wherein N is at least two, and wherein each of the N current sources includes a respective control input and a respective biasing input; and a biasing generator in communication with each of said biasing inputs of the N current sources;

an apparatus input in communication with the control input of a first one of the N current sources; and M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources, and wherein the first one of the M delay elements is in communication with the apparatus input, wherein the M delay elements comprise at least one delay lock loop.]

[14. An apparatus according to claim 13, wherein the mth one of the M delay elements comprises a proportional delay with respect to the m−1th one of the M delay elements.]

[15. An apparatus according to claim 13, wherein the apparatus input is in delayed communication, with respect to a first one of the N current sources, with a second one through the m+1 one of the N current sources.]

[16. An apparatus according to claim 13, wherein the M delay elements are controlled with at least one external signal.]

[17. An apparatus according to claim 13, wherein the M delay elements comprise a uniform delay with respect to one another.]

18. [An apparatus according to claim 13,] *An apparatus comprising:*

*N current sources configured in a parallel arrangement, wherein N is at least two, and wherein each of the N current sources includes a respective control input and a respective biasing input; and*

*a biasing generator in communication with each of said biasing inputs of the N current sources;*

*an apparatus input in communication with the control input of a first one of the N current sources; and*

*M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources, and wherein the first one of the M delay elements is in communication with the apparatus input,* wherein *each of* the M delay elements [comprise at least one delay element comprising] *provides* a [non-uniform] *different* delay *than others of said M delay elements*.

[19. An apparatus according to claim 13, wherein the N current sources each comprises a transistor pair including at least a first transistor in communication with a second transistor.]

[20. An apparatus according to claim 13, wherein the N current sources each comprises a differential transistor pair including at least a first transistor in communication with a second transistor, and wherein said apparatus further comprises an output to provide a differential current.]

[21. An apparatus according to claim 13, wherein the apparatus input communicates with a square waveform.]

[22. An apparatus comprising:

N means for providing current configured in a parallel arrangement, wherein N is at least two, and wherein each of the N current providing means includes respective means for inputting control signals and respective means for inputting biasing signals;

means for biasing in communication with each of said biasing inputting means of the N current providing means;

apparatus means for inputting signals in communication with the means for inputting control signals of a first one of the N current providing means; and M means for delaying, an mth one of the M delaying means including an input in communication with an m−1th one of the M delaying means, wherein M is equal to N−1, and wherein an output of the mth one of the M delaying means is arranged in communication with the control input of an m+1th one of the N current providing means, and wherein a first one of the M delaying means is in communication with the apparatus means for inputting signals, wherein the M delaying means comprises at least one delay lock loop.]

[23. An apparatus according to claim 22, wherein the mth one of the M delaying means comprises a proportional delay with respect to the m−1th one of the M delaying means.]

[24. An apparatus according to claim 22, wherein the apparatus means for inputting signals is in delayed communication, with respect to the first one of the N current providing means, with a second one through the m+1 one of the N current providing means.]

[25. An apparatus according to claim 22, wherein the M delaying means are controlled with at least one external signal.]

[26. An apparatus according to claim 22, wherein the M delaying means comprise a uniform delay with respect to one another.]

27. [An apparatus according to claim 22,] *An apparatus comprising:*

*N means for providing current configured in a parallel arrangement, wherein N is at least two, and wherein each of the N current providing means includes a first transistor with respective means for inputting control signals and a second transistor with respective means for inputting biasing signals;*

*means for biasing in communication with each of said biasing inputting means of the N current providing means;*

*apparatus means for inputting signals in communication with the means for inputting control signals of a first one of the N current providing means; and*

*M means for delaying, an mth one of the M delaying means including an input in communication with an m−1th one of the M delaying means, wherein M is equal to N−1, and wherein an output of the mth one of the M delaying means is arranged in communication with the control input of an m+1th one of the N current providing means, and wherein a first one of the M delaying means is in communication with the apparatus means for inputting signals,* wherein *each of* the M delaying means [comprise at least one delay means comprising a non-uniform delay] *provides a different delay than others of said M delay elements.*

[28. An apparatus according to claim 22, wherein the N current providing means each comprises a transistor pair including at least a first transistor in communication with a second transistor.]

[29. An apparatus according to claim 22, wherein the N current providing means each comprises a differential transistor pair including at least a first transistor in communication with a second transistor, and wherein said apparatus further comprises an output to provide a differential current.]

[30. An apparatus according to claim 22, wherein the apparatus means for inputting signals communicates with a square waveform.]

[31. An electrical circuit comprising:

N transistor pairs configured in a parallel arrangement, where N comprises the total number of transistor pairs, wherein each of the transistor pairs comprises a first transistor in communication with a second transistor;

a biasing transistor in communication with each of the first transistors of the N transistor pairs;

a circuit input in communication with the second transistor of a first one of the N transistor pairs;

an output in communication with each of the first transistors of the N transistor pairs; and M delay elements, an mth one of the M delay elements including an input in communication with an m−1th one of the M delay elements, wherein M is equal to N−1, and wherein an output of the mth one of the M delay elements is arranged in communication with an m+1th one of the N transistor pairs, and wherein a first one of the M delay elements is in communication with the circuit input, wherein the M delay elements comprise at least one delay lock loop.]

[32. An electrical circuit according to claim 31, wherein each of the M delay elements provides a uniform delay.]

[33. An electrical circuit according to claim 31, wherein at least one of the M delay elements comprises a non-uniform delay with respect to the first one of the M delay elements.]

[34. An electrical circuit according to claim 31, wherein the M delay elements are controlled with at least one external signal.]

[35. An electrical circuit according to claim 31, wherein the circuit input communicates with a square waveform.]

[36. An electrical circuit according to claim 31, wherein the electrical circuit provides a current comprising smooth transition areas.]

[37. An electrical circuit comprising:

N means for providing current configured in a parallel arrangement, where N comprises the total number of current providing means, wherein each of the current providing means comprises first means for supplying current in communication with second means for supplying current;

means for biasing in communication with each of the first means for supplying current of the N current providing means;

circuit means for inputting signals in communication with the second means for supplying current of a first one of the N current providing means;

means for outputting signals in communication with each of the first means for supplying current of the N current providing means; and M means for delaying, an mth one of the M delaying means including means for inputting in communication with an m−1th one of the M delaying means, wherein M is equal to N−1, and wherein outputting means of the mth one of the M delaying means is arranged in communication with an m+1th one of the N current providing means, and wherein a first one of the M delaying means is in communication with the circuit inputting means, wherein the M delaying means comprise at least one delay lock loop.]

[38. An electrical circuit according to claim 37, wherein each of the M delaying means provides a uniform delay.]

[39. An electrical circuit according to claim 37, wherein at least one of the M delaying means comprises a non-uniform delay with respect to the first one of the M delaying means.]

[40. An electrical circuit according to claim 37, wherein the M delaying means are controlled with at least one external signal.]

[41. An electrical circuit according to claim 37, wherein the circuit inputting means communicates with a square waveform.]

[42. An electrical circuit according to claim 37, wherein the electrical circuit provides a current comprising smooth transition areas.]

[43. A method comprising the steps of:

providing N transistor pairs configured in a parallel arrangement, where N comprises the total number of transistor pairs, wherein each of the transistor pairs comprises a first transistor in communication with a second transistor;

biasing each of the first transistors of the N transistor pairs;

inputting a signal to the second transistor of a first one of the N transistor pairs;

outputting signals from each of the first transistors of the N transistor pairs; and providing M delay elements, an mth one of the M delay elements including an input in communication with an m−1th one of the M delay elements, wherein M is equal to N−1, and arranging an output of the mth one of the M delay elements in communication with an m+1th one of the N transistor pairs, and wherein a first one of the M delay elements is in communication with the input signal, wherein the M delay elements comprise at least one delay lock loop.]

[44. A method according to claim 43, wherein each of the M delay elements provides a uniform delay.]

[45. A method according to claim 43, wherein at least one of the M delay elements comprises a non-uniform delay with respect to the first one of the M delay elements.]

[46. A method according to claim 43, further comprising the step of controlling the M delay elements with at least one external signal.]

[47. A method according to claim 43, wherein the input signal comprises a square waveform.]

[48. A method according to claim 43, wherein the electrical circuit provides a current comprising smooth transition areas.]

49. Digital-to-analog conversion apparatus, comprising:

structure providing a multilevel digital control signal so that each level has a substantially similar bandwidth;

a plurality of parallel digital-to-analog converters, each receiving a level of the provided multilevel digital control signal, each digital-to-analog converter converting the received level of the digital control signal into an analog signal; and structure combining outputs of said plurality of parallel digital-to-analog converters, further comprising a plurality of low pass filter respectively coupled to outputs of said plurality of parallel digital-to-analog converters.

50. Apparatus according to claim 49, further comprising a plurality of transistors supplying the multilevel digital control signal to said structure providing.

51. Apparatus according to claim 49, further comprising a resistor ladder supplying the multilevel control signal to said structure providing.

52. Apparatus according to claim 49, further comprising a voltage buffer connected to said structure combining.

53. Apparatus for converting a multilevel digital control signal into an analog signal, comprising:

means for providing the multilevel digital control signal where each level has a substantially similar bandwidth;

a plurality of digital-to-analog conversion means, coupled to said means for providing such that each digital-to-analog conversion means receives a different level of the multilevel digital control signal, each of said plurality of digital-to-analog conversion means converting the received level into an analog signal;

means for combining the converted analog signals from said plurality of digital-to-analog conversion means, to form an analog output signal; and a plurality of low pass filter means respectively coupled to outputs of said plurality of digital-to-analog conversion means.

54. Apparatus according to claim 53, wherein said means for providing comprises a transistor array.

55. Apparatus according to claim 53, wherein said means for providing comprises a resistor ladder.

56. A direct drive programmable high speed power digital-to-analog converter comprising:

a first digital to analog converter responsive to a first control signal;

a second digital to analog converter response to a second control signal;

a voltage buffer responsive to said first and second digital to analog converters to provide an analog output;

a decoder to provide the first control signal to said first digital to analog converter and the second control signal to the second analog to digital converter, wherein the first digital to analog converter is activated in response to the first control signal, wherein the second digital to analog converter is activated in response to the second control signal, wherein said first and second control signals determine a slew rate of the analog output.

57. A converter of claim 56, wherein to said first and second digital to analog converters provide substantially the same output level.

58. A converter of claim 56, further comprising first and second control signal generators to generate the first and second control signals, respectively.

59. A converter of claim 58, wherein the first and second control signals have a stair step shape.

60. A converter of claim 58, wherein said first and second control signal generators each comprise:

N current sources configured in a parallel arrangement, wherein N is at least two, and wherein each of the N current sources includes a respective control input; and M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources.

61. A direct drive programmable high speed power digital-to-analog converter comprising:

a first digital to analog converter responsive to a first control signal;

a second digital to analog converter response to a second control signal;

a voltage buffer responsive to said first and second digital to analog converters to provide an analog output;

a decoder to select any combination of said first and second digital to analog converters, wherein said first and second control signals determine a slew rate of the analog output, further comprising first and second low pass filters, wherein said first low pass filter is responsive to said first digital to analog converter and said voltage buffer is responsive to said first low pass filter, and wherein said second low pass filter is responsive to said second digital to analog converter and said voltage buffer is responsive to said second low pass filter.

62. A direct drive programmable high speed power digital-to-analog converter comprising:

first digital to analog converter means responsive to a first control signal for generating a first signal having a first output level;

second digital to analog converter means responsive to a second control signal for generating a second signal having a second output level;

a voltage buffer responsive to said first and second signals for providing an analog output;

decoding means for providing the first control signal to said first digital to analog converter means and the second control signal to the second analog to digital converter means, wherein the first digital to analog converter means is activated in response to the first control signal, wherein the second digital to analog converter means is activated in response to the second control signal, wherein said first and second control signals determine a slew rate of the analog output.

63. A converter of claim 62, wherein the first and second output levels are substantially equal.

64. A converter of claim 62, further comprising first and second control signal generator means for generating the first and second control signals, respectively.

65. A converter of claim 64, wherein the first and second control signals have a stair step shape.

66. A converter of claim 64, wherein said first and second control signal generator means each comprise:

N current sources means each for generating a current and configured in a parallel arrangement, wherein N is at least two, and wherein each of the N current sources includes a respective control input; and M delay means, an mth one of the M delay means including an input in communication with an m−1th one of the M delay means, wherein M is equal to N−1, and wherein an output of the mth one of the M delay means is arranged in communication with the control input of an m+1th one of the N current sources.

67. A direct drive programmable high speed power digital-to-analog converter comprising:

first digital to analog converter means responsive to a first control signal for generating a first signal having a first output level;

second digital to analog converter means responsive to a second control signal for generating a second signal having a second output level;

a voltage buffer responsive to said first and second signals for providing an analog output;

decoding means for selecting any combination of said first and second digital to analog converter means, wherein said first and second control signals determine a slew rate of the analog output, further comprising first and second low pass filter means for low pass filtering said first and second digital to analog converter means, and wherein said voltage buffer is responsive to said first and second low pass filter means.

68. A method for converting a digital signal to an analog signal comprising the steps of:

(a) converting a digital signal to a first analog signal in response to a first control signal, the first analog signal having a first output level;

(b) converting a digital signal to a second analog signal in response to a second control signal, the second analog signal having a second output level;

(c) summing the first and second analog signals for providing an analog output;

(e) decoding an input to generate the first and second control signals;

[(e)] (*f*) activating step (a) in response to the first control signal; [and]

[(f)] (*g*) activating step (b) in response to the second control signal;

(*h*) *filtering the analog output to provide a filtered output; and*

(*i*) *voltage buffering the filtered output,* wherein said first and second control signals determine a slew rate of the analog output.

69. A method of claim 68, further comprising the step of

[(e)] (*i*) low pass filtering the first and second analog signals, wherein step (c) is responsive step [(e)] (*i*).

70. The method of claim 68, wherein the first and second output levels are substantially equal.

71. A method of claim 68, further comprising the step of [(f)] (*i*) generating the first and second control signals.

72. A method of claim 71, wherein the first and second control signals have a stair step shape.

73. A [converter] *method* of claim 71, wherein step [(f)] (*i*) comprises the steps of:

supplying N sources of current, wherein N is at least two;

controlling the supply of current [from ach] *from each* of the N sources of current;

delaying current from M of the N sources of current, where M is equal to N−1; and summing the current supplied from the N source of current.

* * * * *